United States Patent
Said et al.

(10) Patent No.: US 12,150,302 B2
(45) Date of Patent: Nov. 19, 2024

(54) MEMORY DEVICE INCLUDING MIXED OXIDE CHARGE TRAPPING MATERIALS AND METHODS FOR FORMING THE SAME

(71) Applicant: SANDISK TECHNOLOGIES LLC, Addison, TX (US)

(72) Inventors: Ramy Nashed Bassely Said, San Jose, CA (US); Senaka Kanakamedala, San Jose, CA (US); Raghuveer S. Makala, Campbell, CA (US); Peng Zhang, San Jose, CA (US); Yanli Zhang, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 523 days.

(21) Appl. No.: 17/679,335

(22) Filed: Feb. 24, 2022

(65) Prior Publication Data
US 2023/0269939 A1    Aug. 24, 2023

(51) Int. Cl.
| | |
|---|---|
| H01L 27/11582 | (2017.01) |
| H10B 43/10 | (2023.01) |
| H10B 43/27 | (2023.01) |
| H10B 43/35 | (2023.01) |

(52) U.S. Cl.
CPC .......... *H10B 43/27* (2023.02); *H10B 43/10* (2023.02); *H10B 43/35* (2023.02)

(58) Field of Classification Search
CPC ........ H10B 43/27; H10B 43/10; H10B 43/35; H01L 29/40117
See application file for complete search history.

(56) References Cited

U.S. PATENT DOCUMENTS

| | | |
|---|---|---|
| 9,449,985 B1 | 9/2016 | Rabkin et al. |
| 10,516,025 B1 | 12/2019 | Nishikawa et al. |
| 11,101,289 B1 | 8/2021 | Ueda et al. |
| 11,114,462 B1 | 9/2021 | Cui et al. |
| 2006/0001053 A1 | 1/2006 | Wang |
| 2006/0006454 A1 | 1/2006 | Wang |
| 2006/0289924 A1 | 12/2006 | Wang |

(Continued)

OTHER PUBLICATIONS

Notification of Transmittal of the International Search Report and Written Opinion of the International Searching Authority for International Patent Application No. PCT/US2022/030433, mailed Nov. 21, 2022, 9 pages.

(Continued)

*Primary Examiner* — Ermias T Woldegeorgis
(74) *Attorney, Agent, or Firm* — THE MARBURY LAW GROUP PLLC

(57) ABSTRACT

A memory device includes an alternating stack of insulating layers and electrically conductive layers located over a substrate, a memory opening fill structure including a vertical semiconductor channel and a memory film. The memory film includes a tunneling dielectric layer in contact with the vertical semiconductor channel, a first vertical stack of first dielectric oxide material portions located at levels of the insulating layers and including a dielectric oxide material of a first element, and a second vertical stack of second dielectric oxide material portions located at levels of the electrically conductive layers and including a mixed dielectric oxide material that is a dielectric oxide material of the first element and a second element.

20 Claims, 24 Drawing Sheets

(56) References Cited

U.S. PATENT DOCUMENTS

| | | |
|---|---|---|
| 2008/0061321 A1 | 3/2008 | Wang |
| 2014/0045311 A1 | 2/2014 | Doo |
| 2015/0008502 A1* | 1/2015 | Chien ................. H01L 29/7926 |
| | | 438/264 |
| 2015/0050790 A1 | 2/2015 | Lee et al. |
| 2016/0093636 A1 | 3/2016 | Pang et al. |
| 2016/0172366 A1 | 6/2016 | Koka et al. |
| 2016/0300848 A1 | 10/2016 | Pachamuthu et al. |
| 2019/0051661 A1 | 2/2019 | Carlson |
| 2019/0198509 A1* | 6/2019 | Kim ....................... H10B 43/20 |
| 2019/0198519 A1* | 6/2019 | Economy ............... H10B 43/35 |
| 2019/0198520 A1* | 6/2019 | Kim ...................... H01L 23/528 |
| 2021/0265372 A1 | 8/2021 | Kanakamedala et al. |
| 2021/0265385 A1 | 8/2021 | Rajashekhar et al. |
| 2022/0052073 A1 | 2/2022 | Kitazawa et al. |

OTHER PUBLICATIONS

Endoh et al., "Novel Ultra High-Density Memory with a Stacked-Surrounding Gate Transistor (S-SGT) Structured Cell," IEDM Proc. (2001) 33-36.
U.S. Appl. No. 17/507,224, filed Oct. 21, 2021, SanDisk Technologies LLC.

* cited by examiner

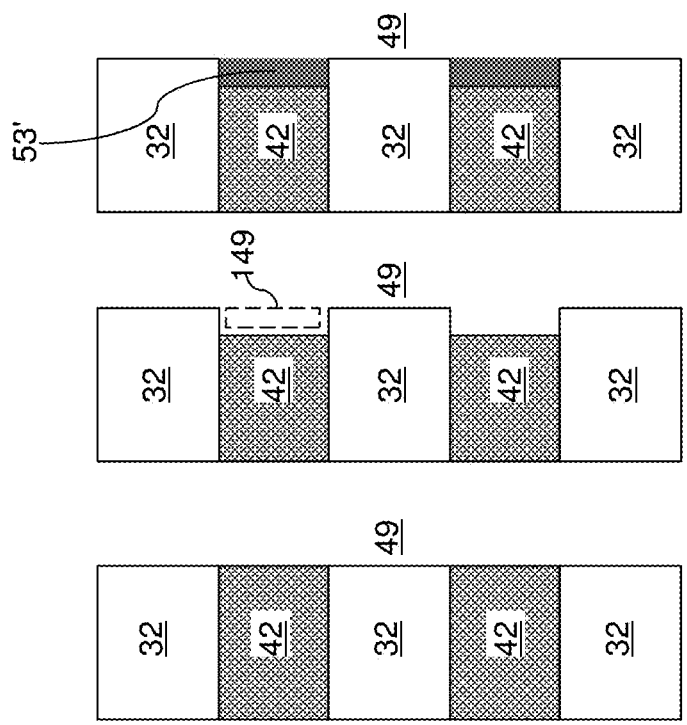

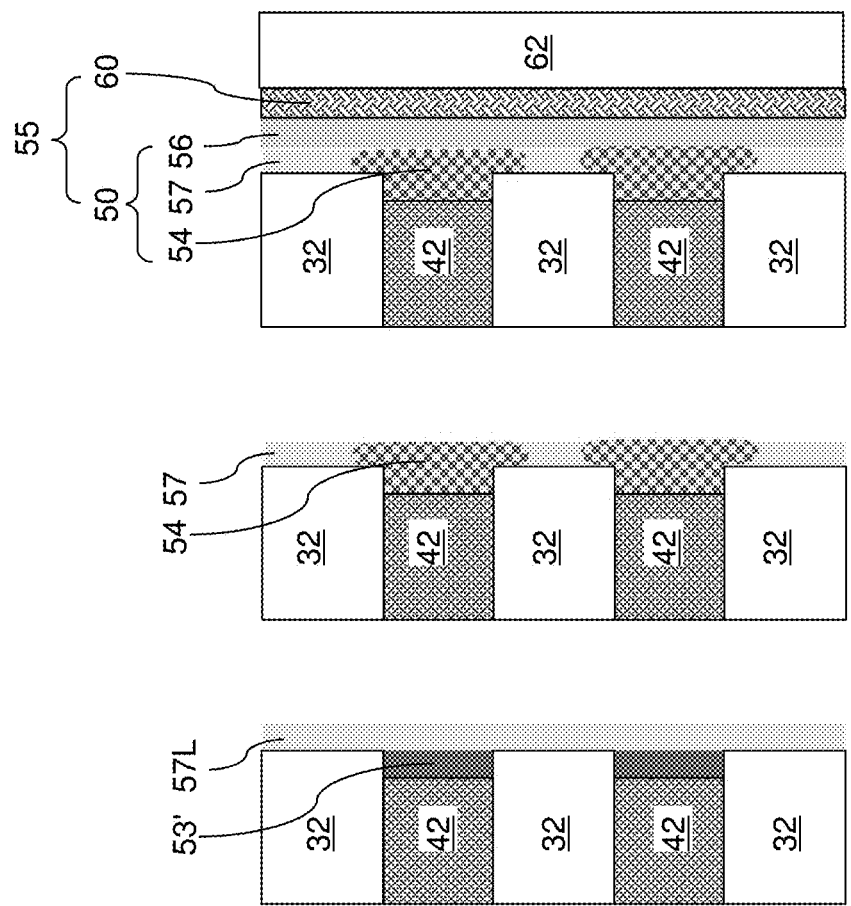

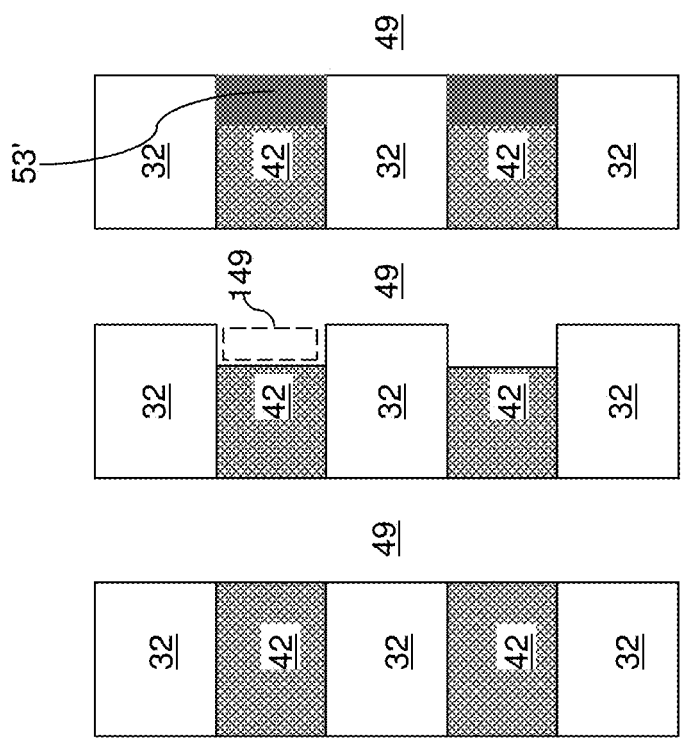

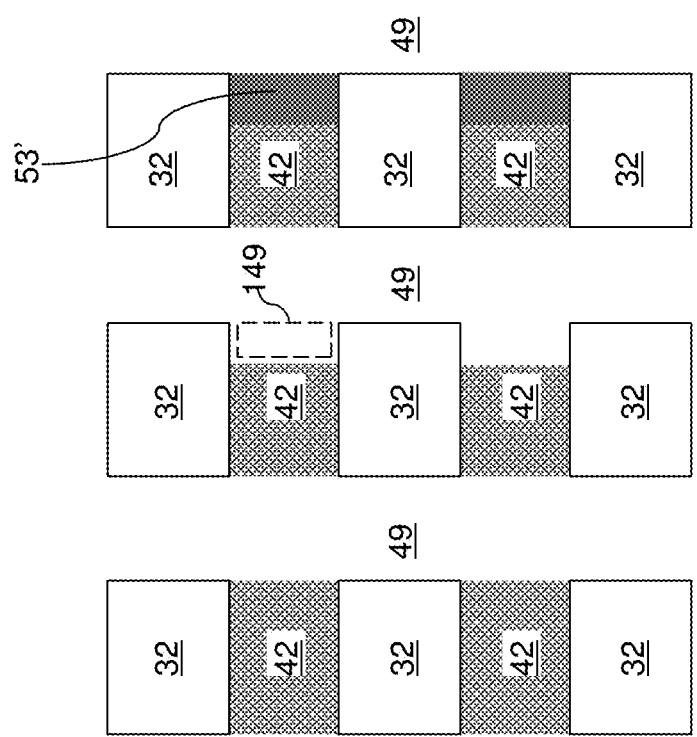

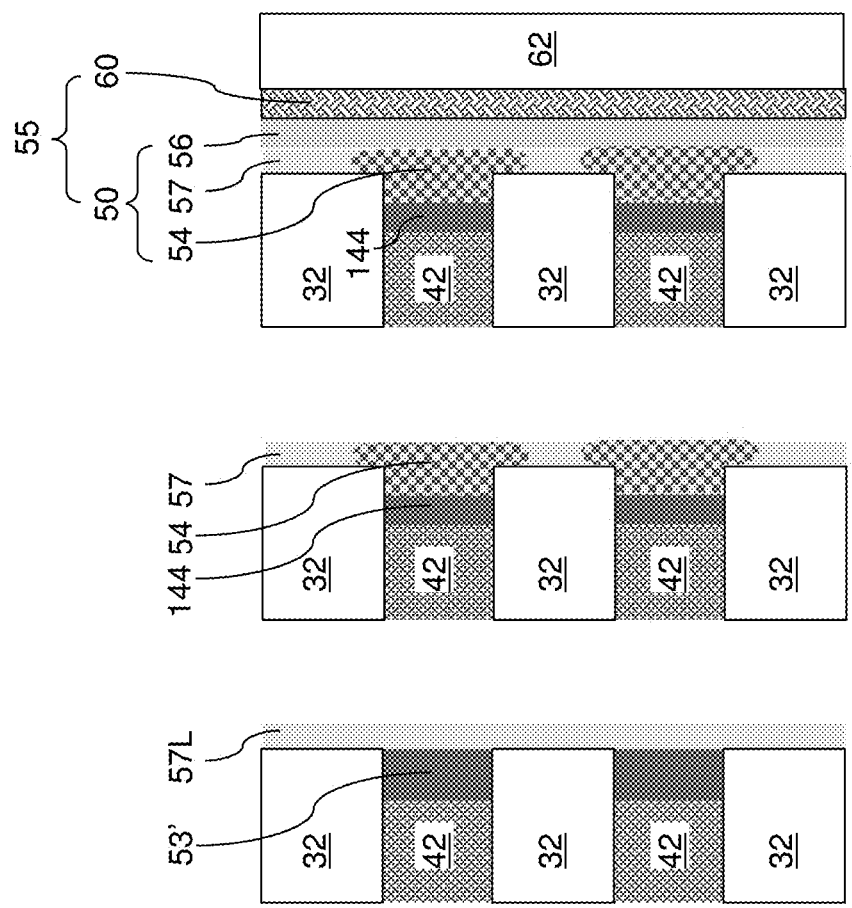

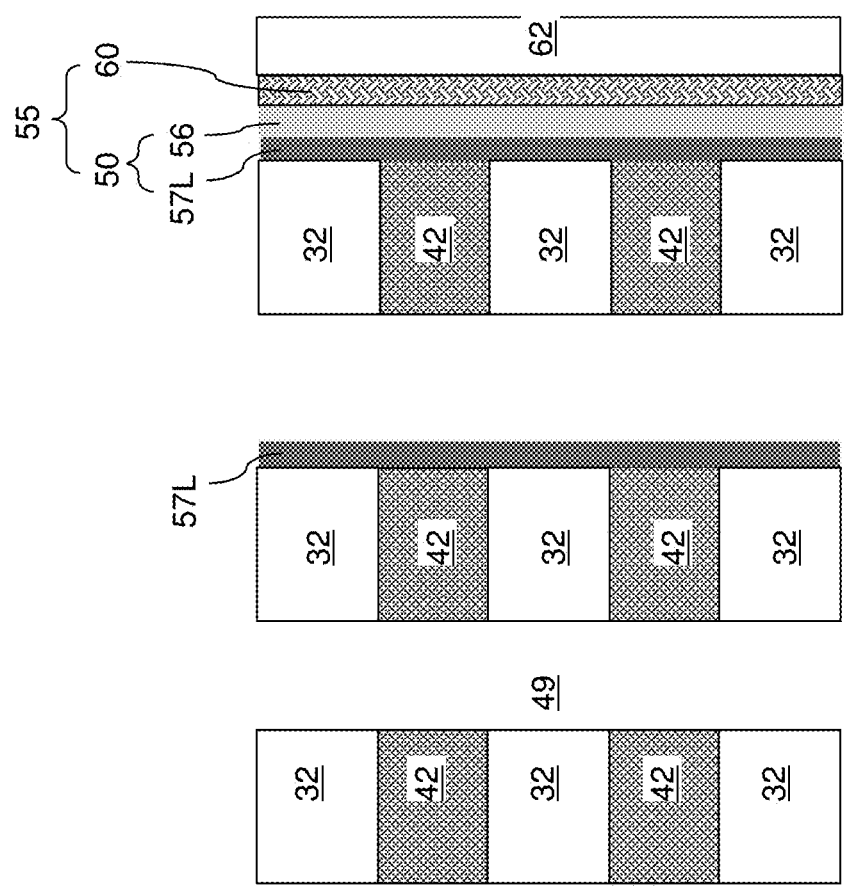

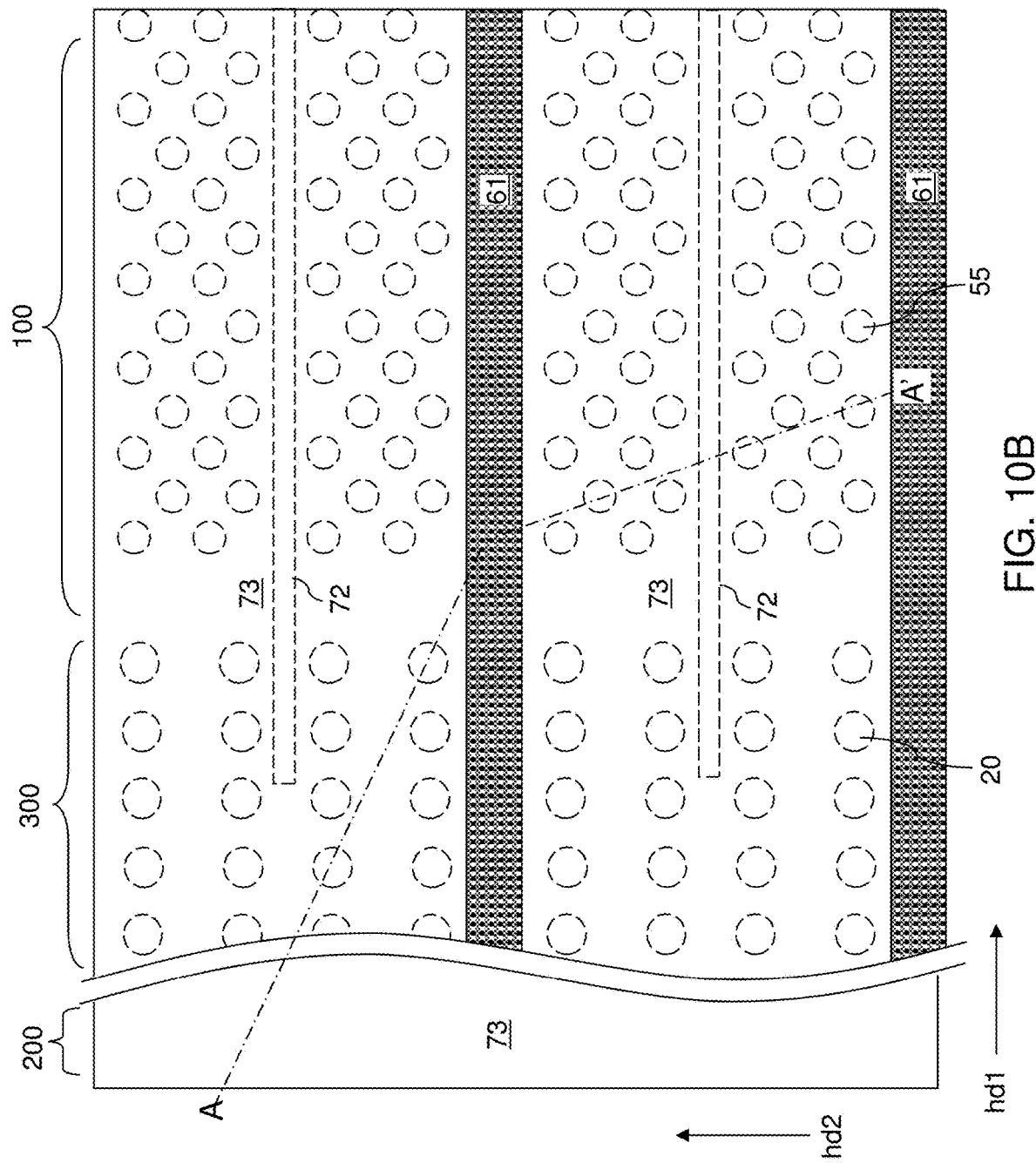

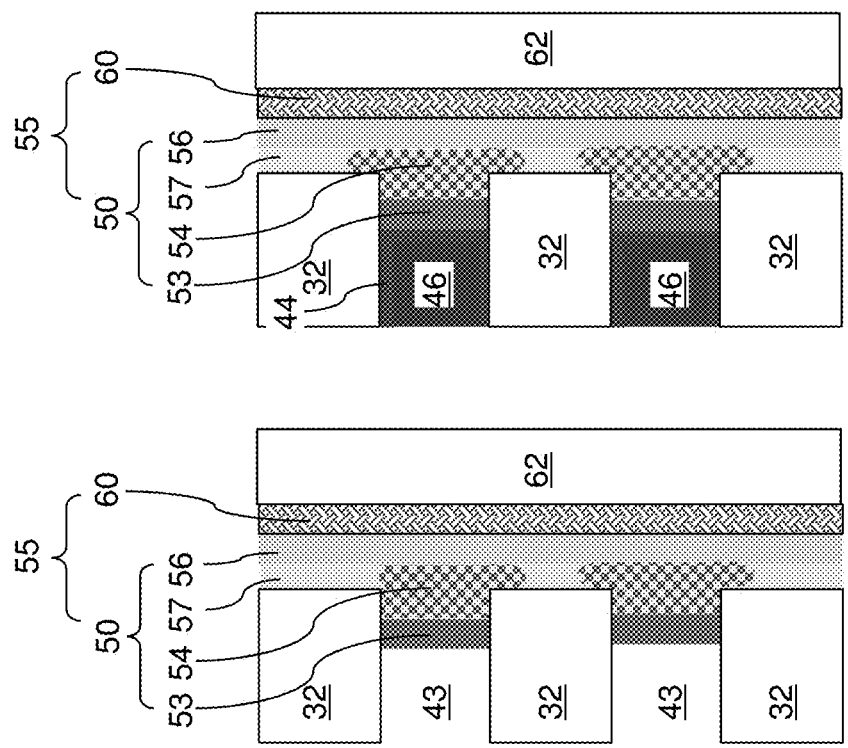

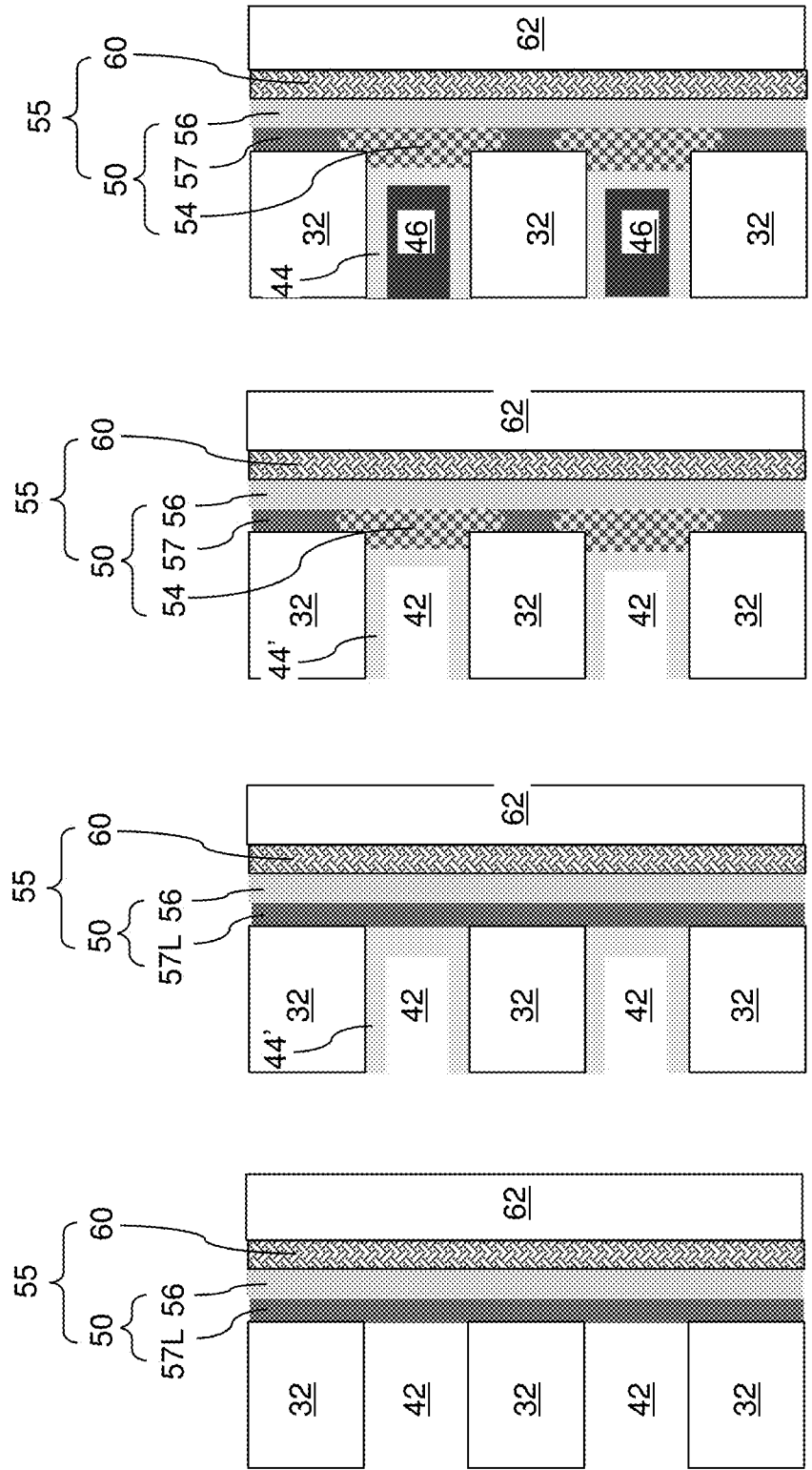

MEMORY DEVICE INCLUDING MIXED OXIDE CHARGE TRAPPING MATERIALS AND METHODS FOR FORMING THE SAME

FIELD

The present disclosure relates generally to the field of semiconductor devices, and particularly to a three-dimensional memory device including mixed oxide charge trapping materials for a memory device and methods for forming the same.

BACKGROUND

Three-dimensional vertical NAND strings having one bit per cell are disclosed in an article by T. Endoh et al., titled "Novel Ultra High-Density Memory With A Stacked-Surrounding Gate Transistor (S-SGT) Structured Cell," IEDM Proc. (2001) 33-36.

SUMMARY

According to an aspect of the present disclosure, a memory device is provided, which comprises: an alternating stack of insulating layers and electrically conductive layers located over a substrate; a memory opening vertically extending through the alternating stack; and a memory opening fill structure located in the memory opening and comprising a vertical semiconductor channel and a memory film, wherein the memory film comprises: a tunneling dielectric layer in contact with the vertical semiconductor channel; a first vertical stack of first dielectric oxide material portions located at levels of the insulating layers and comprising a dielectric oxide material of a first element selected from Al, Si, or transition metal element; and a second vertical stack of second dielectric oxide material portions located at levels of the electrically conductive layers and comprising a mixed dielectric oxide material that is a dielectric oxide material of the first element and a second element that is selected from Al, Si, or transition metal element and different from the first element.

According to another aspect of the present disclosure, a method of forming a memory device is provided, which comprises: forming an alternating stack of insulating layers and spacer material layers over a substrate, wherein the spacer material layers are formed as, or are subsequently replaced with, electrically conductive layers; forming a memory opening through the alternating stack; forming a first dielectric oxide layer comprising a first dielectric oxide material including a dielectric oxide of a first element on a sidewall of the memory opening; forming in-process dielectric oxide material portions comprising an outer dielectric oxide material including a dielectric oxide of a second element that is different from the first element within cavities formed by removal of portions of the spacer material layers that are proximal to the memory opening prior to, or after, formation of the first dielectric oxide layer; forming a tunneling dielectric layer and a vertical semiconductor channel after formation of the first dielectric oxide layer; and inducing intermixing across the first dielectric oxide material and the outer dielectric oxide material, whereby a first vertical stack of first dielectric oxide material portions interlaced with a second vertical stack of second dielectric oxide material portions is formed, wherein the first dielectric oxide material portions are remaining portions of the first dielectric oxide layer that remain at levels of the insulating layers, and the second dielectric oxide material portions are formed at levels of the spacer material layers and comprise a mixed dielectric oxide material that is a dielectric oxide material of the first element and the second element.

BRIEF DESCRIPTION OF THE DRAWINGS

FIGS. 5A-5F are sequential schematic vertical cross-sectional views of a memory opening within the exemplary structure during formation of a first exemplary memory opening fill structure according to a first embodiment of the present disclosure.

FIGS. 6A-6F are sequential schematic vertical cross-sectional views of a memory opening within the exemplary structure during formation of a second exemplary memory opening fill structure according to a second embodiment of the present disclosure.

FIGS. 7A-7F are sequential schematic vertical cross-sectional views of a memory opening within the exemplary structure during formation of a third exemplary memory opening fill structure according to a third embodiment of the present disclosure.

FIGS. 8A-8C are sequential schematic vertical cross-sectional views of a memory opening within the exemplary structure during formation of a fourth exemplary memory opening fill structure according to a fourth embodiment of the present disclosure.

FIG. 10B is a partial see-through top-down view of the exemplary structure of FIG. 10A. The vertical plane A-A' is the plane of the schematic vertical cross-sectional view of FIG. 10A.

FIGS. 13A and 13B are sequential vertical cross-sectional views of a region of the exemplary structure during formation of electrically conductive layers in case the second exemplary memory opening fill structure is present in each memory opening according to the second embodiment of the present disclosure.

FIGS. 15A-15D are sequential vertical cross-sectional views of a region of the exemplary structure during formation of electrically conductive layers in case the fourth exemplary memory opening fill structure is present in each memory opening according to the fourth embodiment of the present disclosure.

DETAILED DESCRIPTION

Figure 1:
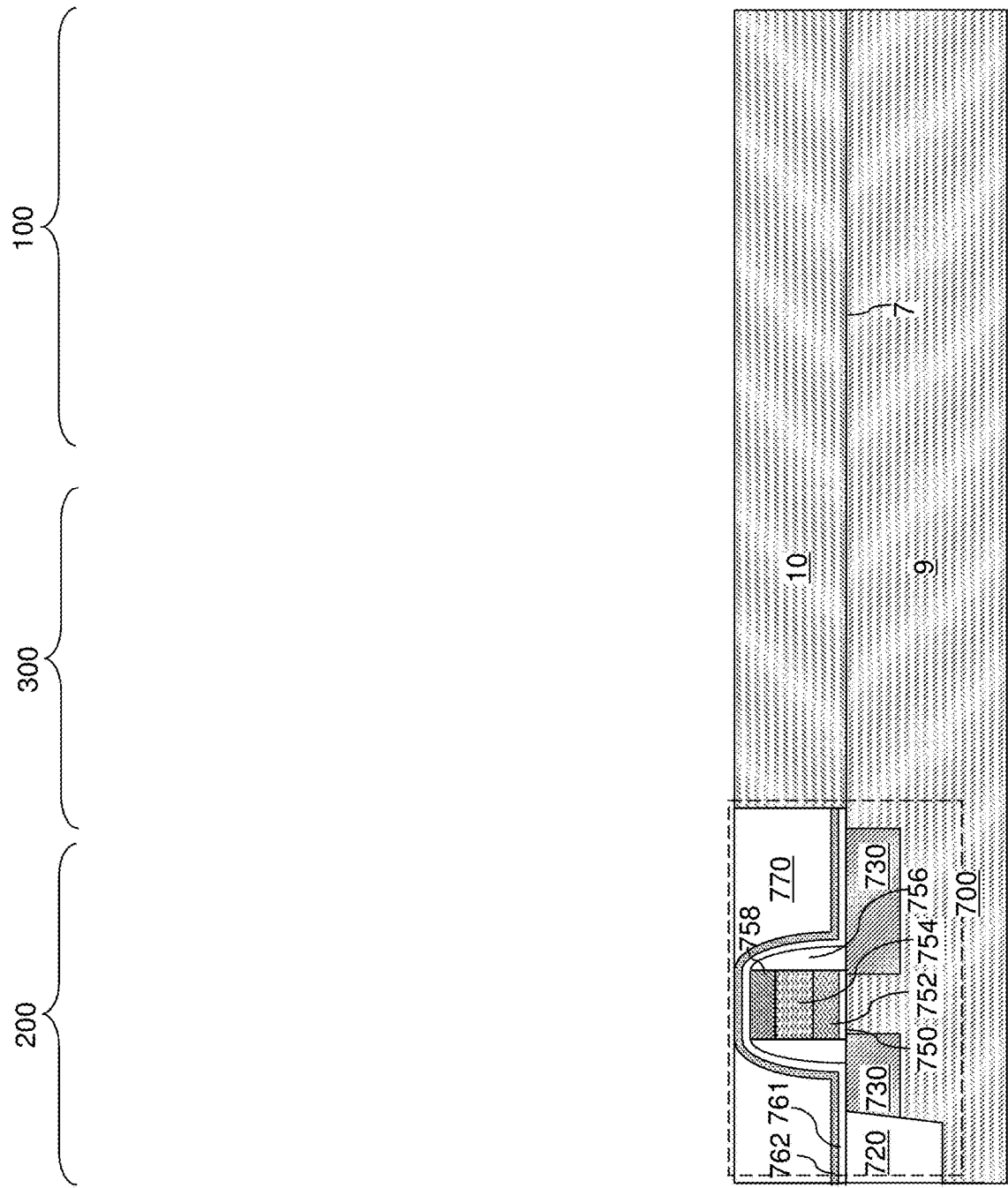
FIG. 1 is a schematic vertical cross-sectional view of an exemplary structure after formation of at least one peripheral device, a semiconductor material layer, and a gate dielectric layer according to an embodiment of the present disclosure.

Good charge trapping characteristics of silicon nitride are based on desirable conduction band minimum (i.e., the lowest energy level of the conduction band) of silicon nitride. Simulations performed by the present inventors indicate that the charge trapping characteristics of charge storage elements in a memory device may be further improved if a dielectric having the same conduction band minimum as silicon nitride and having a higher dielectric constant than the dielectric constant of silicon nitride (which is 7.9) is employed as a charge trapping material. Since it is believed that no single dielectric metal oxide material has the same conduction band minimum as silicon nitride, the present inventors realized that a mixed metal oxide material may be formed which has a conduction band minimum which is about the same as silicon nitride. Such a mixed metal oxide material can have a higher dielectric constant than the dielectric constant of silicon nitride, and may be advantageously employed as a charge trapping material in a memory device to provide superior charge trapping characteristics. The embodiments of the disclosure can be employed to form various structures including a multilevel memory structure, non-limiting examples of which include semiconductor devices, such as three-dimensional memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate can have a major surface 7, which can be, for example, a topmost surface of the substrate semiconductor layer 9. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors.

A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a topmost surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
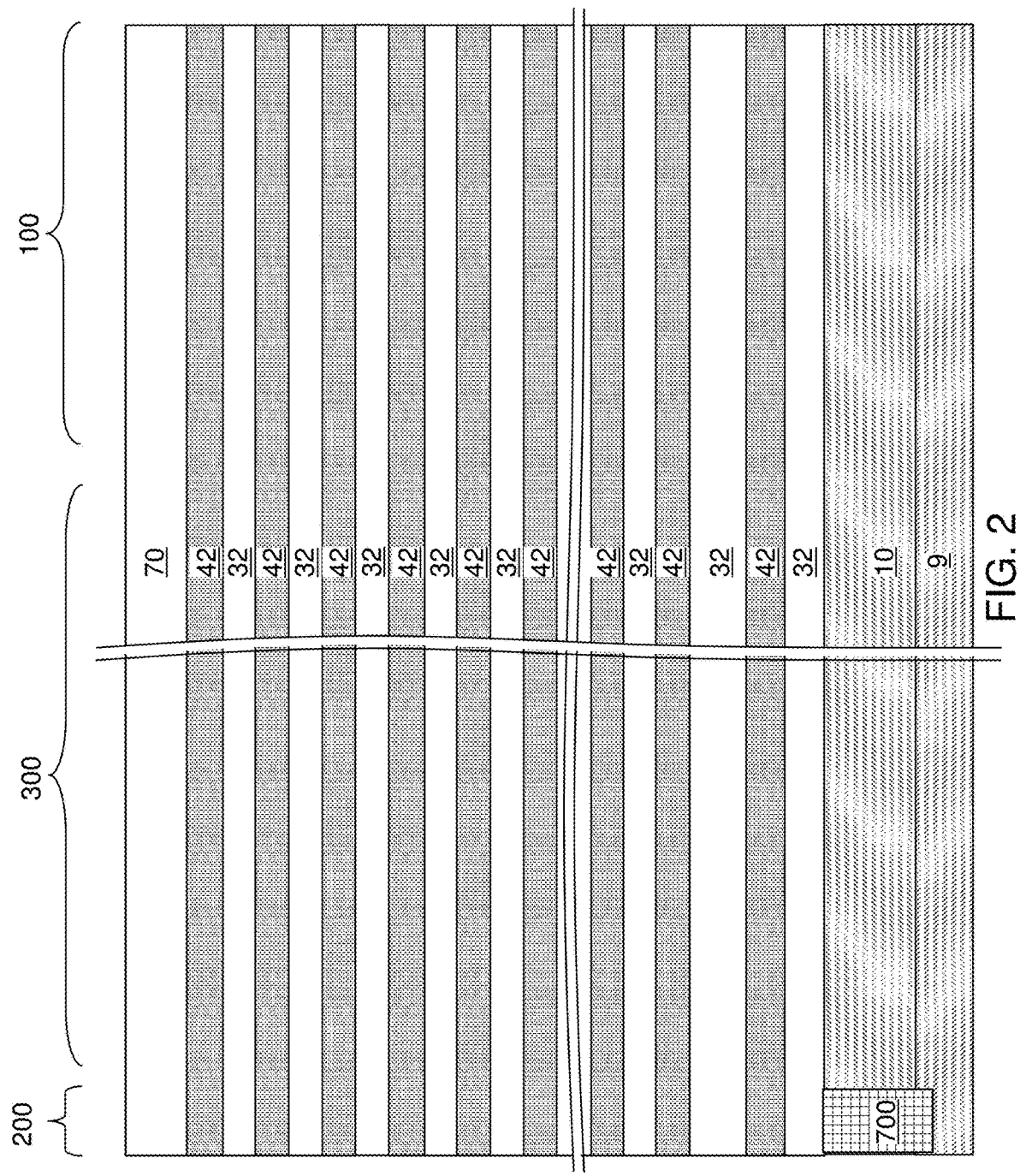
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer 42.

In this case, the stack can include an alternating plurality of insulating layers 32 and sacrificial material layers 42, and constitutes an in-process alternating stack of insulating layers 32 and sacrificial material layers 42. As used herein, a "prototype" structure or an "in-process" structure refers to a transient structure that is subsequently modified in the shape or composition of at least one component therein.

Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride, and can consist essentially of silicon nitride.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer 42 can be in a range from 2 to 1,024, and typically from 8 to 256, although a greater number of repetitions can also be employed. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
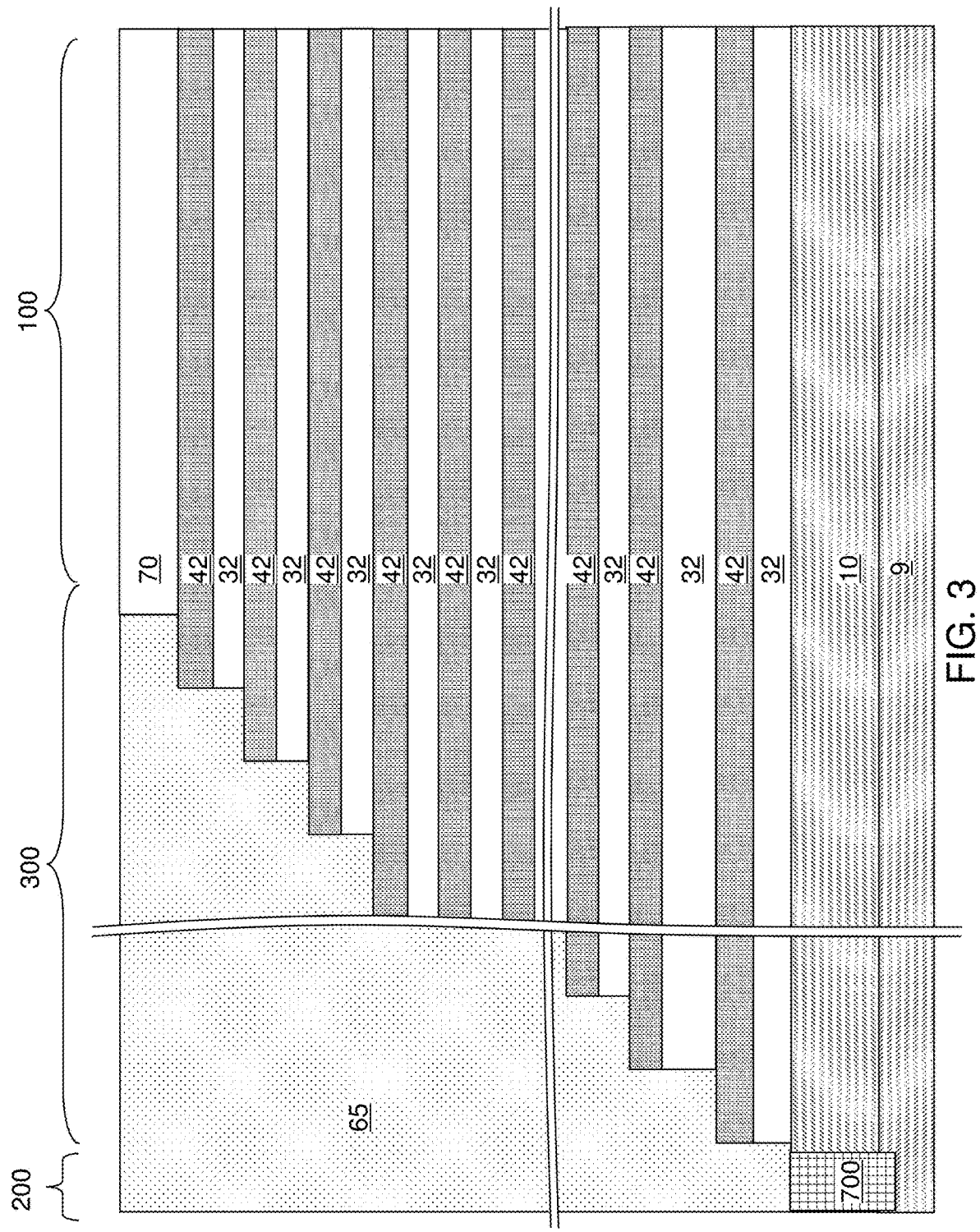
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain-select-level isolation structures 72 can be formed through the insulating cap layer 70 and a subset of the sacrificial material layers 42 located at drain select levels. The drain-select-level isolation structures 72 can be formed, for example, by forming drain-select-level isolation trenches and filling the drain-select-level isolation trenches with a dielectric material such as silicon oxide. Excess portions of the dielectric material can be removed from above the top surface of the insulating cap layer 70.

Figure 4A:
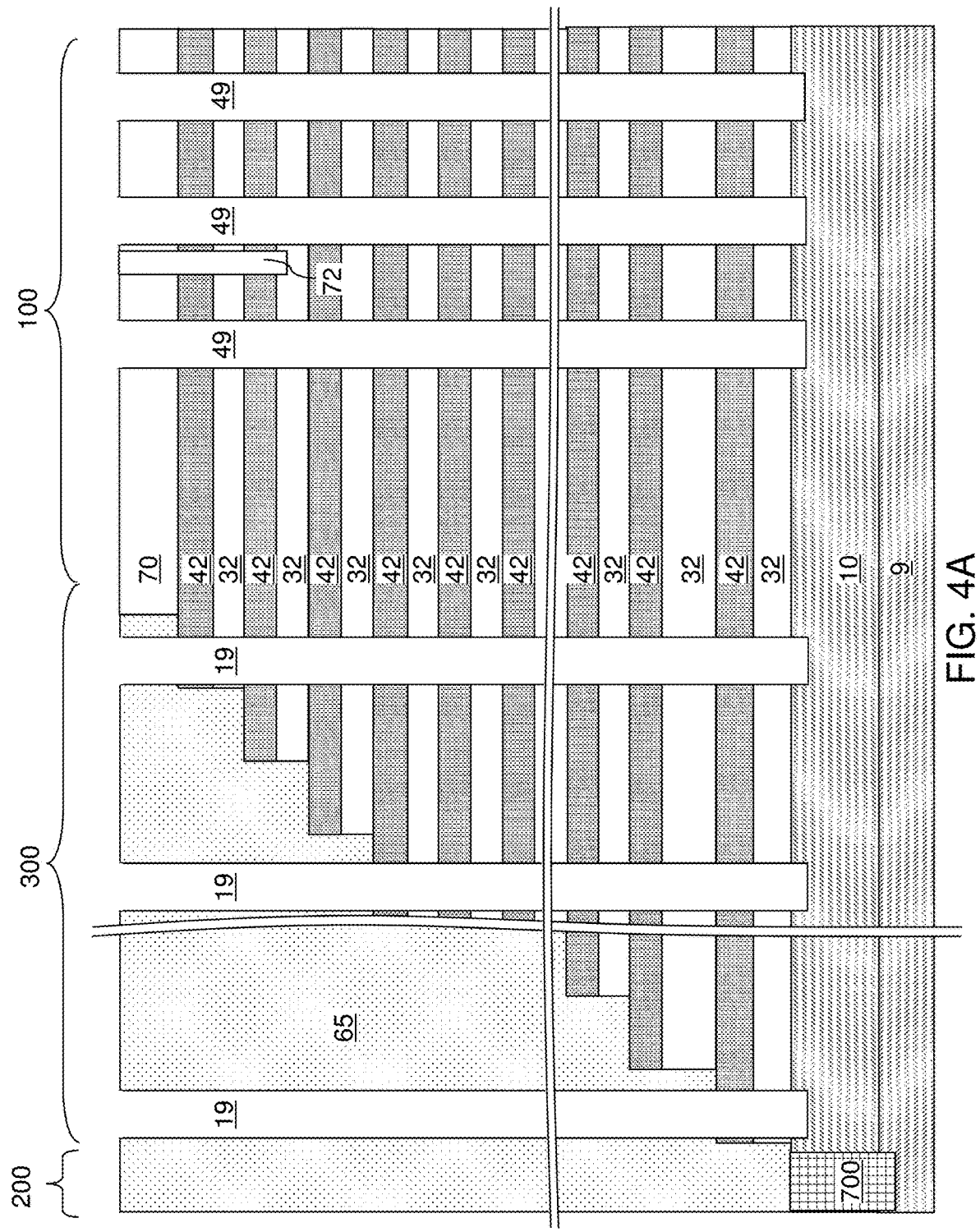
FIG. 4A is a schematic vertical cross-sectional view of the exemplary structure after formation of memory openings and support openings according to an embodiment of the present disclosure.
Figure 4B:
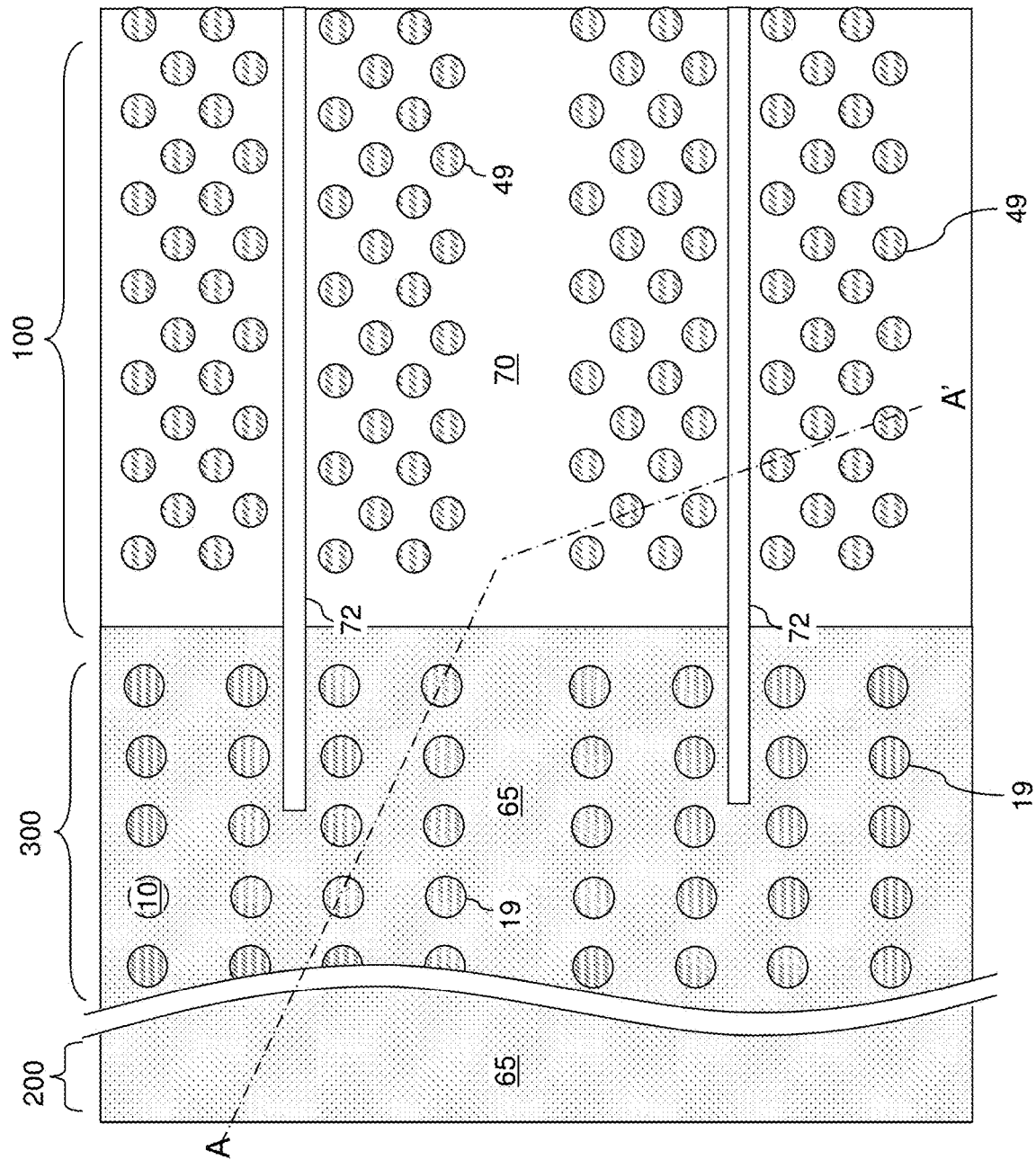
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5F are sequential schematic vertical cross-sectional views of a memory opening within the exemplary structure during formation of a first exemplary memory opening fill structure according to the first embodiment of the present disclosure.

Referring to FIG. 5A, a portion of a memory opening 49 is illustrated after the processing steps of FIGS. 4A and 4B.

Referring to FIG. 5B, lateral recesses 149 can be formed around the memory openings 49 by laterally recessing proximal portions of the spacer material layers (such as the sacrificial material layers 42) selective to the insulating layers 32. For example, an isotropic etch process may be performed that etches the material of the spacer material layers (such as the silicon nitride sacrificial material layers 42) selective to the material of the insulating layers 32. The lateral recesses 149 may be formed using a hot phosphoric acid etch. The lateral recess distance (i.e., the lateral distance between the recessed sidewalls of the sacrificial material layers 42 relative to a cylindrical vertical plane including the sidewalls of the insulating layers 32) can be in a range from 3 nm to 60 nm, such as from 6 nm to 30 nm, although lesser and greater lateral recess distances may also be employed.

Referring to FIG. 5C, a dielectric oxide material can be deposited in the lateral recesses 149 and in peripheral portions of the memory opening 49 by a conformal deposition process such as a chemical vapor deposition process or an atomic layer deposition process. The dielectric oxide material deposited at this step is herein referred to as on outer dielectric oxide material. The outer dielectric oxide material is an in-process dielectric oxide material, at least a portion of which is modified in subsequent processing steps.

An anisotropic etch process can be performed to remove portions of the outer dielectric oxide material that are located outside the volumes of the lateral recesses 149. In other words, portions of the outer dielectric oxide material that are not masked by a respective overlying insulating layer 32 are removed during the anisotropic etch process. Each remaining portion of the outer dielectric oxide material constitutes an in-process dielectric oxide material portions 53', which is formed entirely within a respective one of the lateral recesses.

According to an aspect of the present disclosure, the outer dielectric oxide material comprises a material that can be mixed with another dielectric oxide material to form a charge trapping dielectric oxide material having a conduction band that is located within a range from 2.3 eV to 2.5 eV above the conduction band of silicon. In one embodiment, the charge trapping dielectric oxide material having a conduction band that is located within a range from 2.3 eV to 2.5 eV above Fermi level of electrically conductive layers. In other words, the conduction band offset of the charge trapping dielectric oxide material is between 2.3 eV and 2.5 eV, such as between 2.35 eV and 2.45 eV, such as between 2.38 eV and 2.42 eV, such as 2.4 eV. The electrically conductive layers (e.g., word lines) may be provided as the spacer material layers, or may be formed by subsequent replacement of the spacer material layers with at least one electrically conductive material as will be described below. Device simulations performed by the inventors of the present disclosure show that the level of the conduction band offset of silicon nitride is at a near optimal level for use of silicon nitride as a charge trapping material for silicon channels. However, the device simulations also showed that an increase in the dielectric constant of the charge trapping material while the conduction band offset remains the same can enhance the charge trapping characteristics (e.g., high temperature data retention) of the charge trapping material. Thus, the outer dielectric oxide material and an inner dielectric oxide material (to be subsequently formed) of the embodiments of the present disclosure are selected such that a mixed dielectric oxide material thereof has a conduction band offset close to the conduction band offset of silicon nitride and has a dielectric constant greater than the dielectric constant of silicon nitride may be obtained upon suitable alloying of the outer dielectric oxide material and the inner dielectric oxide material to form the mixed dielectric oxide material. The thickness of outer dielectric oxide material and the inner dielectric oxide material may be selected to form the mixed metal oxide with a conduction band offset of about 2.4 eV. For example, in Ti—Si—O mixed metal oxide system, the thickness of $TiO_2$ and $SiO_2$ layers should be in a ratio of 1:3 to form $Ti_{0.25}Si_{0.75}O_2$ mixed metal oxide having a conduction band offset of about 2.4 eV.

Generally, the inner dielectric oxide material (or a first dielectric oxide material) to be subsequently formed includes, and/or consists essentially of, a dielectric compound of a first element and oxygen, i.e., a first dielectric oxide of the first element and oxygen. The outer dielectric oxide material of the in-process dielectric oxide material portions 53' includes, and/or consists essentially of, the outer dielectric oxide material which is a dielectric compound of a second element and oxygen. The second element is different from the first element. Each of the first element and the second element is independently selected from Al, Si, or transition metal elements provided that a mixture of dielectric oxide of the first element and the dielectric oxide of the second element can provide a conduction band offset between 2.3 eV and 2.5 eV, such as about 2.4 eV and a dielectric constant greater than the dielectric constant of silicon nitride (i.e., greater than 7.9). In one embodiment, the transition metal elements may comprise one or more of Ti, Y, or Hf.

In an illustrative example, the combination of the first element and the second element may be selected from a combination of titanium and silicon, a combination of hafnium and silicon, a combination of titanium and aluminum, a combination of hafnium and aluminum, a combination of tantalum and aluminum, a combination of aluminum and yttrium, or a combination of silicon and yttrium. The first element may comprise one of Ti, Hf, Ta, Al, Si or Y. The second element may comprise another one of Ti, Hf, Ta, Al, Si or Y.

In one embodiment, the mixed dielectric oxide material to be subsequently formed may have average material composition that is selected from: $Ti_\alpha Si_{1-\alpha}O_{2(1+\theta)}$ in which a is in a range from 0.15 to 0.35, such as 0.2 to 0.3, such as 0.25; $Hf_\beta Si_{1-\beta}O_{2(1+\theta)}$ in which $\beta$ is in a range from 0.34 to 0.54, such as 0.39 to 0.49, such as 0.44; $Ti_\gamma Al_{4/3(1-\gamma)}O_{2(1+\theta)}$ in which $\gamma$ is in a range from 0.04 to 0.24, such as 0.09 to 0.19, such as 0.14; $Hf_\delta Al_{4/3(1-\delta)}O_{2(1+\theta)}$ in which $\delta$ is in a range from 0.19 to 0.39, such as 0.24 to 0.34, such as 0.29; $Ta_\varepsilon Al_{4/3(1-\varepsilon)}O_{2(1+\theta)}$ in which & is in a range from 0.06 to 0.26, such as 0.11 to 0.21, such as 0.16; $Al_\zeta Y_{1-\zeta}O_{1.5(1+\theta)}$ in which $\zeta$ is in a range from 0.10 to 0.30, such as 0.15 to 0.25, such as 0.2; and $Si_\eta Y_{4/3(1-\eta)}O_{2(1+\theta)}$ in which n is in a range from 0.01 to 0.21, such as 0.06 to 0.16, such as 0.11, and wherein 0 has a value in a range from −0.1 to 0.1, including zero.

The in-process dielectric oxide material portions 53' may have a material composition in which the atomic concentration of the second element is at least 99%, such as at least 99.9% and/or at least 99.99%, of the atomic concentration of all silicon and metal atoms within the in-process dielectric oxide material portions 53'. Each in-process dielectric oxide material portion 53' may have a cylindrical shape having a cylindrical inner sidewall, an annular top surface adjoined to an upper periphery of the cylindrical inner sidewall, an annular bottom surface adjoined to a lower periphery of the cylindrical inner sidewall, and a cylindrical outer sidewall in contact with a respective one of the sacrificial material layers 42 and adjoined to an outer periphery of the annular top surface and to an outer periphery of the annular bottom surface. In one embodiment, the cylindrical inner sidewalls of the in-process dielectric oxide material portions 53' may be vertically coincident with sidewalls of the insulating layers 32 around the memory opening 49. In one example, the in-process dielectric oxide material portions 53' may comprise titanium dioxide.

Referring to FIG. 5D, a dielectric oxide material layer can be deposited on the sidewalls of the insulating layers 32 and the cylindrical inner sidewalls of the in-process dielectric oxide material portions 53' by a conformal deposition process such as a chemical vapor deposition process or an atomic layer deposition process. The dielectric oxide material layer includes the dielectric oxide of the first element discussed above, and is herein referred to as a first dielectric oxide layer 57L. The first dielectric oxide layer 57L may consist essentially of the first element and oxygen atoms. For example, the first dielectric oxide layer 54L may comprise silicon dioxide. The first dielectric oxide layer 57L may have a thickness in a range from 3 nm to 30 nm, such as from 6 nm to 15 nm, although lesser and greater thicknesses may also be employed. The first dielectric oxide layer 57L comprises, and/or consists essentially of, a first dielectric oxide material including the dielectric oxide of the first element, and is formed directly on a sidewall of the memory opening 49 such as the sidewalls of the insulating layers 32 around the memory opening 49. Generally, the thickness of the first dielectric oxide layer 57L may be selected to be conducive to formation of the target material composition for the mixed oxide dielectric material to be employed as a charge trapping material.

Referring to FIG. 5E, a thermal anneal process can be performed to induce interdiffusion between the first dielectric oxide material (i.e., an inner dielectric oxide material) of the first dielectric oxide layer 57L and the outer dielectric oxide material of the in-process dielectric oxide material portions 53'. The elevated temperature and the duration of the thermal anneal process can be selected such that the in-process dielectric oxide material portions 53' and portions of the first dielectric oxide layer 57L that are proximal to the in-process dielectric oxide material portions 53' interdiffuse with each other to form second dielectric oxide material portions 54 that comprise a second dielectric oxide material. In one embodiment, the entirety of the in-process dielectric oxide material portions 53' may be converted into outer regions of the second dielectric oxide material portions 54. The second dielectric oxide material is a compound of the first element, the second element, and oxygen. Specifically, the second dielectric oxide material is a dielectric oxide of the first element and the second element. Portions of the first dielectric oxide layer 57L that do not substantially change in material composition after the thermal anneal process are herein referred to first dielectric oxide material portions 57.

Generally, a first vertical stack of first dielectric oxide material portions 57 and a second vertical stack of second dielectric oxide material portions 54 can be formed within each memory opening 49. The first vertical stack of the first dielectric oxide material portions 57 can be interlaced with the second vertical stack of the second dielectric oxide material portions 54 along the vertical direction. The first dielectric oxide material portions 57 are remaining portions of the first dielectric oxide layer 57L that remain at levels of the insulating layers 32. The second dielectric oxide material portions 54 are formed at levels of the spacer material layers (such as the sacrificial material layers 42) and comprise a mixed dielectric oxide material that is a dielectric oxide material of the first element and the second element. The first dielectric oxide material portions 57 separate adjacent second dielectric oxide material portions 54 along the vertical direction. The second dielectric oxide material portions 54 comprise discrete charge storage regions formed from a mixed metal oxide material (i.e., an oxide of at least two different metals or an oxide of silicon and at least one metal).

In one embodiment, the first dielectric oxide material of the first dielectric oxide material portions 57 may comprise, and/or may consist essentially of, a dielectric oxide material of the first element, which may be selected from Al, Si, or transition metal element. The second dielectric oxide material, i.e., the mixed dielectric oxide material, of the second dielectric oxide material portions 54 may be located at levels of the spacer material layers (such as the sacrificial material layers 42) and may comprise, and/or may consist essentially of, the first element and the second element. The second element is different from the first element, and can be selected from Al, Si, or transition metal element.

In one embodiment, the second dielectric oxide material portions 54 can have a compositional gradient in which the atomic concentration of the second element increases with a distance from a most proximal interface with the first dielectric oxide material portions 57. In one embodiment, the atomic concentration of the first element within the first dielectric oxide material portions 57 may be at least 99% of the atomic concentration of all metal atoms within the first dielectric oxide material portions 57.

In one embodiment, each of the second dielectric oxide material portions 54 may have a greater lateral thickness between a respective inner sidewall and a respective outer sidewall than each of the first dielectric oxide material portions 57.

In one embodiment, inner sidewalls of the second dielectric oxide material portions 54 and inner sidewalls of the first dielectric oxide material portions 57 may be vertically coincident with each other (i.e., located within a same vertical cylindrical plane), and outermost sidewall segments of the second dielectric oxide material portions 54 may be laterally offset outward from the outer sidewalls of the first dielectric oxide material portions 57. Specifically, the second dielectric oxide material portions 54 (i.e., charge storage regions) may have a hammerhead shape due to vertical diffusion of the second oxide material.

Each outer sidewall of the second dielectric oxide material portions 57 may have a stepped vertical cross-sectional profile. In one embodiment, each outer sidewall of the second dielectric oxide material portions 57 may comprise a primary cylindrical outer sidewall segment in contact with a respective spacer material layer (such as a respective sacrificial material layer 42), an upper annular horizontal surface segment in contact with a respective overlying insulating layer 32, an upper cylindrical outer sidewall segment in contact with the respective overlying insulating layer 32, a lower annular horizontal surface segment in contact with a respective underlying insulating layer 32, and a lower cylindrical outer sidewall segment in contact with the respective underlying insulating layer 32. In one embodiment, one, and/or a plurality, and/or each, and of the second dielectric oxide material portions 54 contacts a horizontal bottom surface and a sidewall of an overlying one of the insulating layers 32, and a horizontal top surface and a sidewall of an underlying one of the insulating layers 32.

Referring to FIG. 5F, a tunneling dielectric layer 56 can be deposited over the interlaced vertical stacks of the first dielectric oxide material portions 57 and the second dielectric oxide material portions 54 by a conformal deposition process such as a chemical vapor deposition process or an atomic layer deposition process. The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

Optionally, a sacrificial cover material layer (not shown) may be deposited over the tunneling dielectric layer 56. The sacrificial cover material layer includes a sacrificial cover material that may be subsequently removed selective to the material of the tunneling dielectric layer 56. In an illustrative example, the sacrificial cover material layer may comprise amorphous silicon or amorphous carbon, and may have a thickness in a range from 1 nm to 10 nm, such as from 2 nm to 5 nm, although lesser and greater thicknesses may also be employed. An anisotropic etch process can be performed to remove a horizontally-extending portions of the sacrificial cover material layer and the tunneling dielectric layer 56. A semiconductor surface, such as a surface of the semiconductor material layer 10, can be physically exposed through an opening in a bottom portion of the tunneling dielectric layer 56 within each memory opening 49. Remaining portions of the sacrificial cover material layer may be removed by performing an isotropic etch process that selectively etches the material of the sacrificial cover material layer without etching the material of the tunneling dielectric layer 56. A contiguous combination of a first vertical stack of first dielectric oxide material portions 57, a second vertical stack of second dielectric oxide material portions 54, and a tunneling dielectric layer 56 within each memory opening 49 constitutes a memory film 50.

A semiconductor channel layer can be deposited directly on the physically exposed semiconductor surface of the semiconductor material layer 10 underneath the opening in a bottom portion of the tunneling dielectric layer 56 within each memory opening 49. The semiconductor channel layer includes a semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel layer includes amorphous silicon or polysilicon. The semiconductor channel layer can have a doping of a first conductivity type, which is the same as the conductivity type of the semiconductor material layer 10. The semiconductor channel layer can be formed by a conformal deposition method such as low pressure chemical vapor deposition (LPCVD). The thickness of the semiconductor channel layer can be in a range from 2 nm to 10 nm, although lesser and greater thicknesses can also be employed. The semiconductor channel layer may partially fill a remaining volume of each memory opening 49, or may fully fill the entirety of the remaining volume of each memory opening 49.

In case each memory opening 49 is not completely filled by the semiconductor channel layer, a dielectric core layer can be deposited in the remaining volume of each memory opening 49. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating. A horizontal portion of the dielectric core layer overlying the insulating cap layer 70 can be removed, for example, by a recess etch process. The recess etch process may be continued its such that each remaining portions of the dielectric core layer is located within a respective memory opening 49 and has a respective top surface below the horizontal plane including the top surface of the insulating cap layer 70. Each remaining portion of the dielectric core layer constitutes a dielectric core 62.

A doped semiconductor material having a doping of a second conductivity type can be deposited within each recessed region above the dielectric cores 62. The deposited semiconductor material can have a doping of a second conductivity type that is the opposite of the first conductivity type. For example, if the first conductivity type is p-type, the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer that overlies the insulating cap layer 70 can be removed from above the horizontal plane including the top surface of the insulating cap layer 70, for example, by chemical mechanical planarization (CMP) or a recess etch process. Each remaining portion of the doped semiconductor material having a doping of the second conductivity type constitutes a drain region 63 (shown in FIG. 9). Each remaining portion of the semiconductor channel layer (which has a doping of the first conductivity type) constitutes a vertical semiconductor channel 60. The vertical semiconductor channel 60 is formed directly on the tunneling dielectric layer 56.

A tunneling dielectric layer 56 is surrounded by a combination of a first vertical stack of first dielectric oxide material portions 57 and a second vertical stack of second dielectric oxide material portions 54. The tunneling dielectric layer 56 laterally surrounds the vertical semiconductor channel 60. Each contiguous set of a first vertical stack of first dielectric oxide material portions 57, a second vertical stack of second dielectric oxide material portions 54, and a tunneling dielectric layer 56 collectively constitute a memory film 50, which can store electrical charges with a macroscopic retention time. As used herein, a macroscopic retention time refers to a retention time suitable for operation of a memory device as a permanent memory device such as a retention time in excess of 24 hours. Each combination of a memory film 50 and a vertical semiconductor channel 60 within a memory opening 49 constitutes a memory stack structure 55. An entire set of material portions that fills a memory opening 49 is herein referred to as a memory opening fill structure. An entire set of material portions that fills a support opening 19 constitutes a support pillar structure.

FIGS. 6A-6F are sequential schematic vertical cross-sectional views of a memory opening within the exemplary structure during formation of a second exemplary memory opening fill structure according to the second embodiment of the present disclosure.

Referring to FIG. 6A, a portion of a memory opening 49 is illustrated after the processing steps of FIGS. 4A and 4B.

Referring to FIG. 6B, lateral recesses 149 can be formed around the memory openings 49 by laterally recessing proximal portions of the spacer material layers (such as the sacrificial material layers 42) selective to the insulating layers 32. The processing steps of FIG. 5B may be performed with an increased duration of the isotropic etch process that laterally recesses the spacer material layers (such as the sacrificial material layers 42). The lateral recess distance (i.e., the lateral distance between the recessed sidewalls of the sacrificial material layers 42 relative to a cylindrical vertical plane including the sidewalls of the insulating layers 32) can be in a range from 4 nm to 100 nm, such as from 8 nm to 40 nm, although lesser and greater lateral recess distances may also be employed.

Referring to FIG. 6C, in-process dielectric oxide material portions 53' can be formed in the lateral recesses 149 by performing the processing steps of FIG. 5C. In the second embodiment, the in-process dielectric oxide material portions 53' shown in FIG. 6C have a greater lateral thickness than the in-process dielectric oxide material portions 53' of FIG. 5C the first embodiment.

Figure 6F:
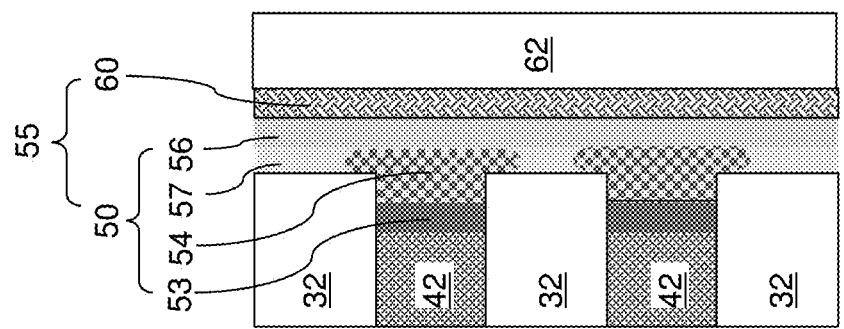
Figure 6E:
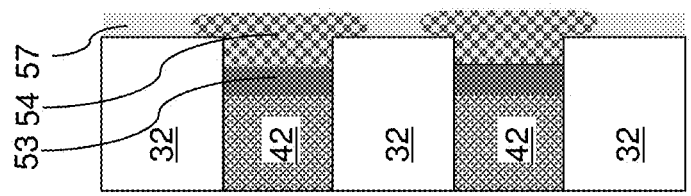
Figure 6D:
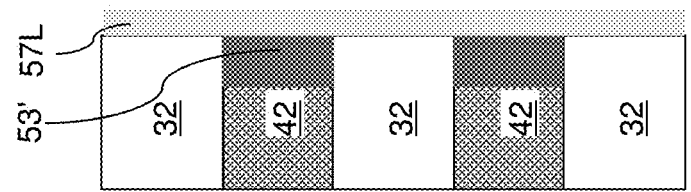

Referring to FIG. 6D, a first dielectric oxide layer 57L can be formed on the vertical stack of in-process dielectric oxide material portions 53' in each memory opening 49 by performing the processing steps of FIG. 5D.

Referring to FIG. 6E, a thermal anneal process can be performed to induce interdiffusion between the first dielectric oxide material (i.e., an inner dielectric oxide material) of the first dielectric oxide layer 57L and the outer dielectric oxide material of the in-process dielectric oxide material portions 53'. The elevated temperature and the duration of the thermal anneal process can be selected such that the in-process dielectric oxide material portions 53' and portions of the first dielectric oxide layer 57L that are proximal to the in-process dielectric oxide material portions 53' interdiffuse with each other to form the second dielectric oxide material portions 54 that comprise a second dielectric oxide material. Further, the elevated temperature and the duration of the thermal anneal process can be selected such that the material composition of regions of the in-process dielectric oxide material portions 53' that are distal from the first dielectric oxide layer 57L remain substantially the same after the thermal anneal process.

In one embodiment, regions of the in-process dielectric oxide material portions 53' that are proximal to the first dielectric oxide layer 57L may be converted into outer regions of the second dielectric oxide material portions 54. Regions of the in-process dielectric oxide material portions 53' that are distal from the first dielectric oxide layer 57L remain without interdiffusing to form annular cylindrical dielectric material portions 53 comprising a substantially same material as the in-process dielectric oxide material portions 53' as formed at the processing steps of FIG. 6C. The second dielectric oxide material of the annular cylindrical dielectric material portions 53 comprises substantially same material as the in-process dielectric oxide material portions is a compound of the first element, the second element, and oxygen. The second dielectric oxide material portions 54 comprise the second dielectric oxide material which is a dielectric oxide of the first element and the second element. Portions of the first dielectric oxide layer 57L that do not substantially change in material composition after the thermal anneal process are herein referred to first dielectric oxide material portions 57.

Generally, a first vertical stack of first dielectric oxide material portions 57 and a second vertical stack of second dielectric oxide material portions 54 can be formed within each memory opening 49. The first vertical stack of the first dielectric oxide material portions 57 can be interlaced with the second vertical stack of the second dielectric oxide material portions 54 along the vertical direction. The first dielectric oxide material portions 57 are remaining portions of the first dielectric oxide layer 57L that remain at levels of the insulating layers 32. The second dielectric oxide material portions 54 are formed at levels of the spacer material layers (such as the sacrificial material layers 42) and comprise a mixed dielectric oxide material that is a dielectric oxide material of the first element and the second element. The annular cylindrical dielectric material portions 53 may comprise, and/or may consist essentially of, the dielectric oxide of the second element. Each of the annular cylindrical dielectric material portions 53 may have a respective inner cylindrical sidewall, a respective outer cylindrical sidewall, a respective upper annular horizontal surface, and a respective lower annular horizontal surface. Each of the upper annular horizontal surface and the lower annular horizontal surface may have a respective inner periphery that is adjoined to a periphery of an inner cylindrical sidewall and a respective outer periphery that is adjoined to a periphery of an outer cylindrical sidewall.

In one embodiment, the first dielectric oxide material of the first dielectric oxide material portions 57 may comprise, and/or may consist essentially of, a dielectric oxide material of the first element, which may be selected from Al, Si, or a transition metal element. The second dielectric oxide material, i.e., the mixed dielectric oxide material, of the second dielectric oxide material portions 54 may be located at levels of the spacer material layers (such as the sacrificial material layers 42) and may comprise, and/or may consist essentially of, the first element and the second element. The second element is different from the first element, and can be selected from Al, Si, or transition metal element.

In one embodiment, the second dielectric oxide material portions 54 can have a compositional gradient in which the atomic concentration of the second element increases with a distance from a most proximal interface with the first dielectric oxide material portions 57. In one embodiment, the atomic concentration of the first element within the first dielectric oxide material portions 57 may be at least 99% of the atomic concentration of all metal atoms within the first dielectric oxide material portions 57. In one embodiment, the atomic concentration of the second element within the annular cylindrical dielectric material portions 53 may be at least 99% of the atomic concentration of all metal atoms within the annular cylindrical dielectric material portions 53.

In one embodiment, each of the second dielectric oxide material portions 54 may have a greater lateral thickness between a respective annular cylindrical dielectric material portion 53 and the first dielectric oxide material portion 57 than between the respective insulating layer 32 and the first dielectric oxide material portion 57. In one embodiment, inner sidewalls of the second dielectric oxide material portions 54 and inner sidewalls of the first dielectric oxide material portions 57 may be vertically coincident with each other (i.e., located within a same vertical cylindrical plane), and outermost sidewall segments of the second dielectric oxide material portions 54 may be laterally offset outward from the outer sidewalls of the first dielectric oxide material portions 57.

Each outer sidewall of the second dielectric oxide material portions 57 may have a stepped vertical cross-sectional profile. In one embodiment, each outer sidewall of the second dielectric oxide material portions 57 may comprise a primary cylindrical outer sidewall segment in contact with a respective spacer material layer (such as a respective sacrificial material layer 42), an upper annular horizontal surface segment in contact with a respective overlying insulating layer 32, an upper cylindrical outer sidewall segment in contact with the respective overlying insulating layer 32, a lower annular horizontal surface segment in contact with a respective underlying insulating layer 32, and a lower cylindrical outer sidewall segment in contact with the respective underlying insulating layer 32. In one embodiment, one, and/or a plurality, and/or each, and of the second dielectric oxide material portions 54 contacts a horizontal bottom surface and a sidewall of an overlying one of the insulating layers 32, and a horizontal top surface and a sidewall of an underlying one of the insulating layers 32.

Referring to FIG. 6F, the processing steps of FIG. 5F may be performed to form a tunneling dielectric layer 56, a vertical semiconductor channel 60, a dielectric core 62, and a drain region in each memory opening 49. In the second embodiment, the annular cylindrical dielectric material portions 53 comprise front side blocking dielectric portions, and may comprise silicon oxide, aluminum oxide, or another dielectric metal oxide. The second dielectric oxide material portions 54 comprise discrete mixed metal oxide charge storage regions.

FIGS. 7A-7F are sequential schematic vertical cross-sectional views of a memory opening within the exemplary structure during formation of a third exemplary memory opening fill structure according to the third embodiment of the present disclosure. The steps shown in FIGS. 7A-7F are identical to the steps shown in respective FIGS. 6A-6F and described above with respect to the second embodiment. However, in the third embodiment, each of the annular cylindrical dielectric material portions 53 is referred to as a blocking dielectric material portion 144, as will be described in more detail below.

FIGS. 8A-8C are sequential schematic vertical cross-sectional views of a memory opening within the exemplary structure during formation of a fourth exemplary memory opening fill structure according to the fourth embodiment of the present disclosure.

Referring to FIG. 8A, a portion of a memory opening 49 is illustrated after the processing steps of FIGS. 4A and 4B.

Referring to FIG. 8B, the processing steps of FIG. 5D can be performed to deposit a first dielectric oxide layer 57L on a sidewall of each memory opening 49.

Referring to FIG. 8C, the processing steps of FIG. 5F may be performed to form a tunneling dielectric layer 56, a vertical semiconductor channel 60, a dielectric core 62, and a drain region in each memory opening 49.

Figure 9:
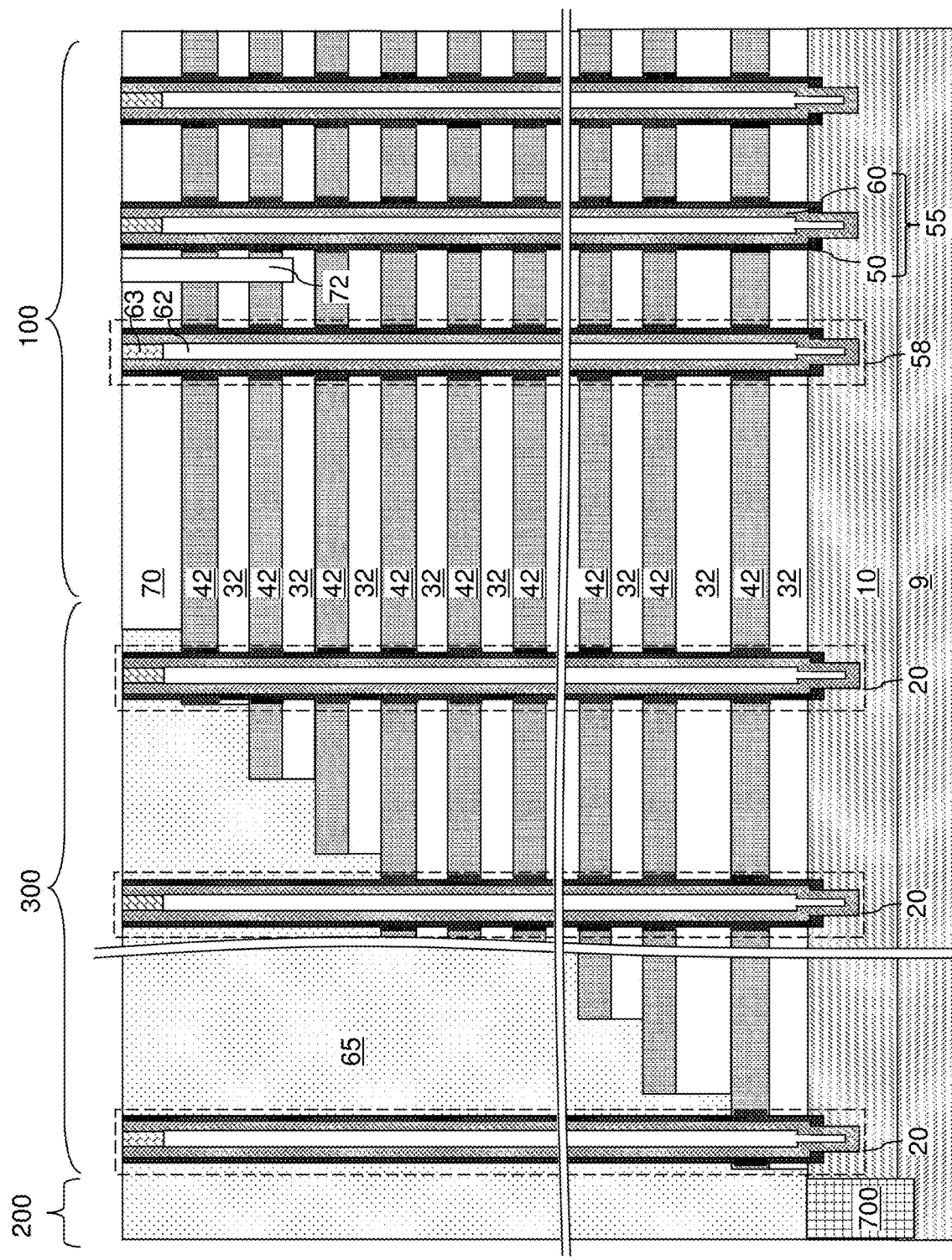
FIG. 9 is a schematic vertical cross-sectional view of the exemplary structure after formation of memory opening fill structures and support pillar structures according to an embodiment of the present disclosure.

Referring to FIG. 9, the exemplary structure is illustrated after formation of memory opening fill structures 58 and support pillar structure 20 within the memory openings 49 and the support openings 19, respectively. Each memory opening fill structure 58 comprises a memory stack structure 55, a drain region 63 and an optional dielectric core 62. Each memory stack structure 55 includes a vertical semiconductor channel 60 and a memory film 50. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Figure 10A:
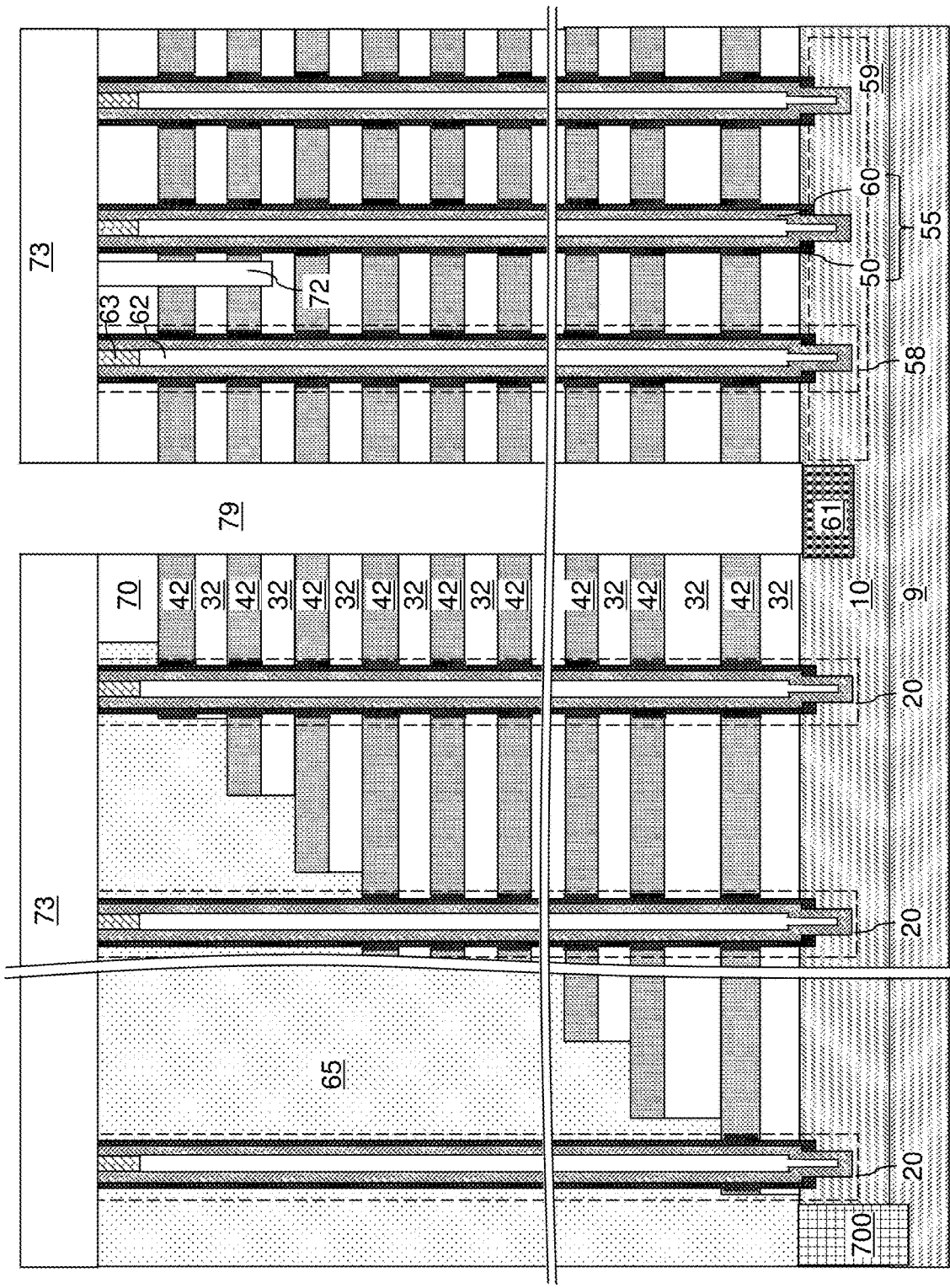
FIG. 10A is a schematic vertical cross-sectional view of the exemplary structure after formation of backside trenches according to an embodiment of the present disclosure.

Referring to FIGS. 10A and 10B, a contact-level dielectric layer 73 can be formed over the alternating stack (32, 42) of insulating layer 32 and sacrificial material layers 42, and over the memory opening fill structures 58 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory opening fill structures 58. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain-select-level isolation structures 72 can laterally extend along the first horizontal direction hd1. Each backside trench 79 can have a uniform width that is invariant along the lengthwise direction (i.e., along the first horizontal direction hd1). Each drain-select-level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain-select-level isolation structure 72, or between a neighboring pair of drain-select-level isolation structures 72. In one embodiment, the backside trenches 79 can include a source contact opening in which a source contact via structure can be subsequently formed. The photoresist layer can be removed, for example, by ashing.

A source region 61 can be formed at a surface portion of the semiconductor material layer 10 under each backside trench 79 by implantation of electrical dopants into physically exposed surface portions of the semiconductor material layer 10. An upper portion of the semiconductor material layer 10 that extends between the source region 61 and the vertical semiconductor channels 60 within the memory stack structures 55 constitutes a horizontal semiconductor channel 59 for a plurality of field effect transistors.

Figure 11:
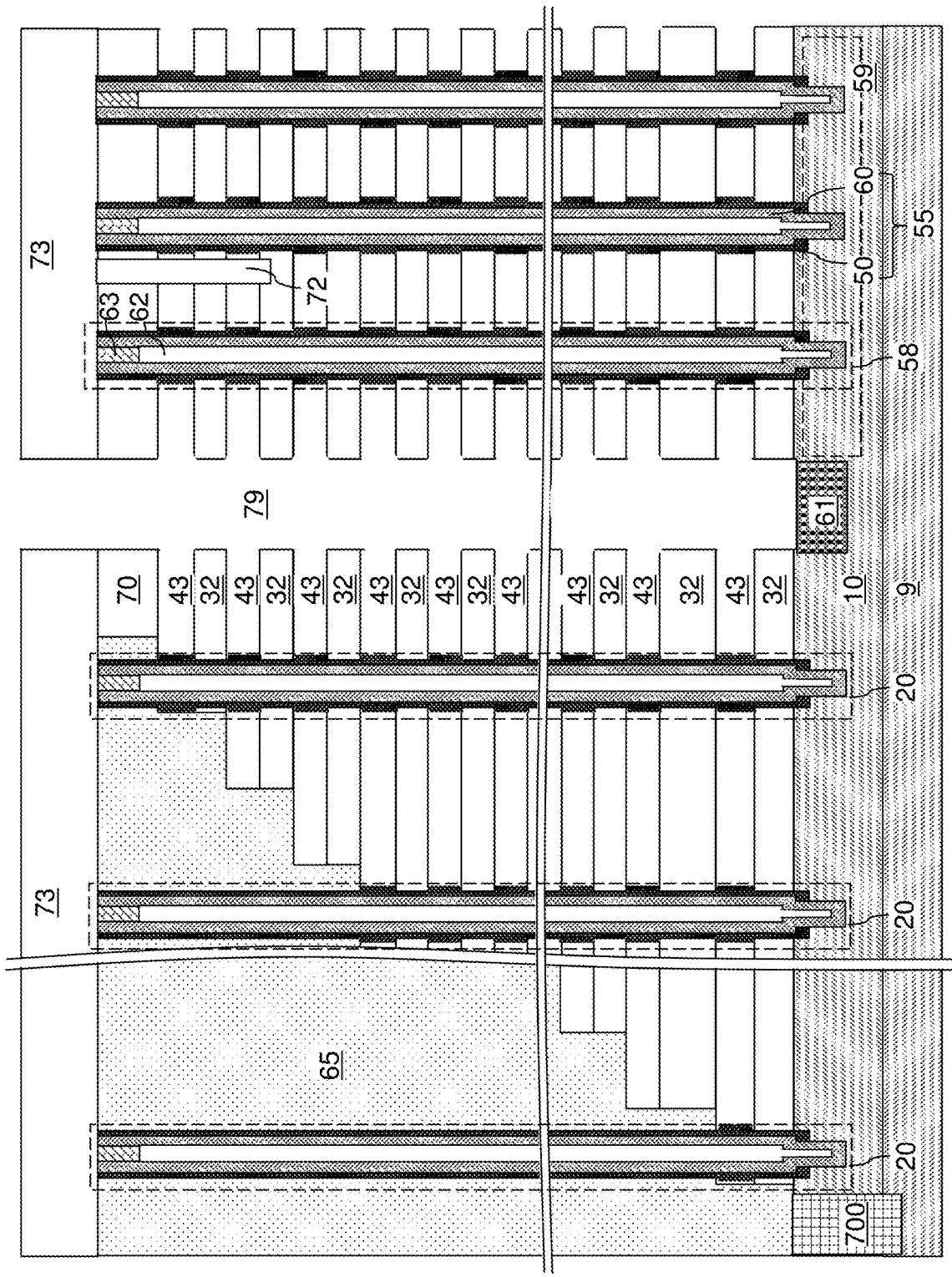
FIG. 11 is a schematic vertical cross-sectional view of the exemplary structure after formation of backside recesses according to an embodiment of the present disclosure.

Referring to FIG. 11, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings 49 in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 12B:
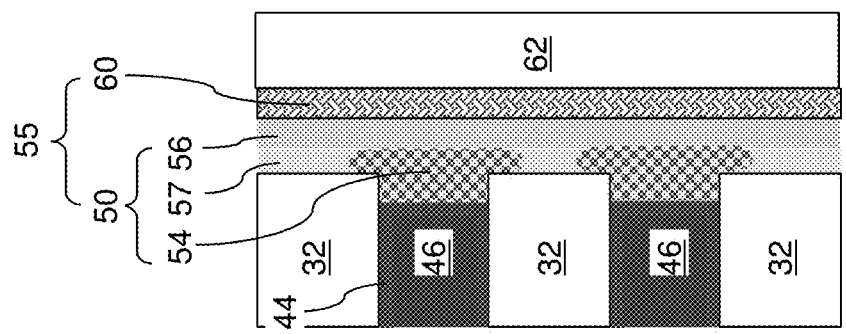
FIGS. 12A and 12B are sequential vertical cross-sectional views of a region of the exemplary structure during formation of electrically conductive layers in case the first exemplary memory opening fill structure is present in each memory opening according to the first embodiment of the present disclosure.
Figure 12A:
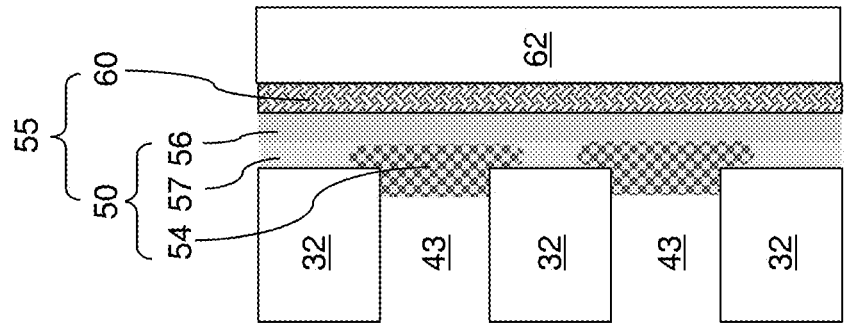

FIGS. 12A and 12B are sequential vertical cross-sectional views of a region of the exemplary structure during formation of electrically conductive layers 46 in case the first exemplary memory opening fill structure of FIG. 5F is present in each memory opening 49 according to the first embodiment of the present disclosure.

Referring to FIG. 12A, a first configuration of the exemplary structure is illustrated, which corresponds to the case in which the first exemplary memory opening fill structure is present in each memory opening 49. The outer sidewall of each second dielectric oxide material portion 54 can be physically exposed to a respective one of the backside recesses 43.

Referring to FIG. 12B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. In one embodiment, the backside blocking dielectric layer 44 can consist essentially of aluminum oxide. Alternatively or additionally, the backside blocking dielectric layer 44 can include a silicon oxide layer. The backside blocking dielectric layer 44 may consist essentially of a dielectric oxide of a single element such as aluminum, silicon, or a transition metal.

In one embodiment, the backside blocking dielectric layer 44 can be formed by a conformal deposition process such as atomic layer deposition (ALD). The thickness of the backside blocking dielectric layer 44 can be in a range from 1 nm to 15 nm, such as 2 to 6 nm, although lesser and greater thicknesses can also be employed. The backside blocking dielectric layer 44 is formed on the sidewalls of the backside trenches 79, horizontal surfaces and sidewalls of the insulating layers 32, the portions of the sidewall surfaces of the memory films 50. A backside cavity 79' is present within the portion of each backside trench 79 that is not filled with the backside blocking dielectric layer 44.

A metallic barrier layer can be deposited in the backside recesses 43. The metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN.

A metal fill material is deposited in the plurality of backside recesses 43, on the sidewalls of the at least one the backside trench 79, and over the top surface of the contact-level dielectric layer 73 to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 can be formed in the plurality of backside recesses 43, and a continuous metallic material layer can be formed on the sidewalls of each backside trench 79 and over the contact-level dielectric layer 73. Each electrically conductive layer 46 includes a portion of the metallic barrier layer and a portion of the metallic fill material layer that are located between a vertically neighboring pair of dielectric material layers such as a pair of insulating layers 32. The continuous metallic material layer includes a continuous portion of the metallic barrier layer and a continuous portion of the metallic fill material layer that are located in the backside trenches 79 or above the contact-level dielectric layer 73. Each sacrificial material layer 42 can be replaced with an electrically conductive layer 46. A backside cavity 79' is present in the portion of each backside trench 79 that is not filled with the backside blocking dielectric layer 44 and the continuous metallic material layer.

The deposited metallic material of the continuous electrically conductive material layer is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

At least one bottommost electrically conductive layer 46 and at least one topmost electrically conductive layer 46 provided upon formation of the electrically conductive layers 46 within the alternating stack (32, 46) can comprise a respective source side and drain side select gate electrode for the vertical NAND memory string. Each source region 61 is formed in an upper portion of the semiconductor substrate (9, 10). Semiconductor channels (59, 60) extend between each source region 61 and a respective set of drain regions 63. The semiconductor channels (59, 60) include the horizontal semiconductor channel 59 and the vertical semiconductor channels 60 of the memory stack structures 55.

FIGS. 13A and 13B are sequential vertical cross-sectional views of a region of the exemplary structure during formation of electrically conductive layers 46 in case the second exemplary memory opening fill structure of FIG. 6F is present in each memory opening 49 according to the second embodiment of the present disclosure.

Referring to FIG. 13A, a second configuration of the exemplary structure is illustrated, which corresponds to the case in which the second exemplary memory opening fill structure is present in each memory opening 49. The outer sidewall of each annular cylindrical dielectric material portion 53 can be physically exposed to a respective one of the backside recesses 43.

Referring to FIG. 13B, the processing steps of FIG. 12B can be performed to form a backside blocking dielectric layer 44 and an electrically conductive layer 46 within each backside recess 43.

Generally, each of the second dielectric oxide material portions 54 is laterally spaced from the electrically conductive layers 46 by a respective composite blocking dielectric material portion. In the second configuration of the exemplary structure illustrated in FIG. 13B, each of the blocking dielectric material portions comprises a backside blocking dielectric layer 44 and a front side blocking dielectric portion comprising the annular cylindrical dielectric material portion 53. The backside blocking dielectric layer 44 embeds a respective one of the electrically conductive layers 46 and comprises a respective upper horizontally-extending portion contacting a bottom surface of a respective overlying one of the insulating layers 32, a respective lower horizontally-extending portion contacting a top surface of a respective underlying one of the insulating layers 32, and a cylindrical portion laterally surrounding the memory opening fill structure 58 and vertically connecting an inner periphery of the respective upper horizontally-extending potion and an inner periphery of the respective lower horizontally-extending portion. In one embodiment, each of the respective backside blocking dielectric layers 44 is laterally spaced from a respective one of the second dielectric oxide material portions 54 by a respective annular cylindrical dielectric material portion 53 consisting essentially of a dielectric oxide of the second element.

Figure 14B:
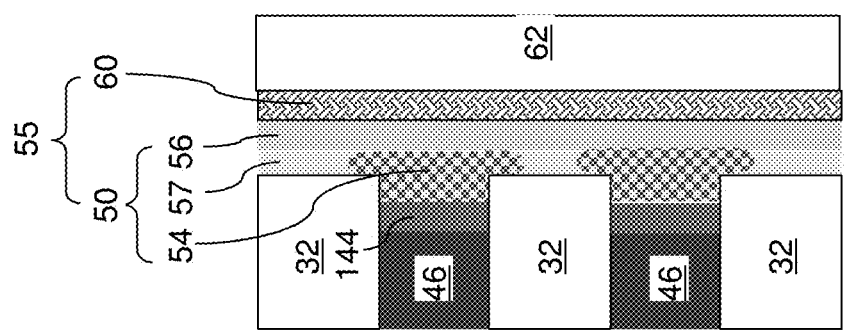
FIGS. 14A and 14B are sequential vertical cross-sectional views of a region of the exemplary structure during formation of electrically conductive layers in case the third exemplary memory opening fill structure is present in each memory opening according to the third embodiment of the present disclosure.
Figure 14A:
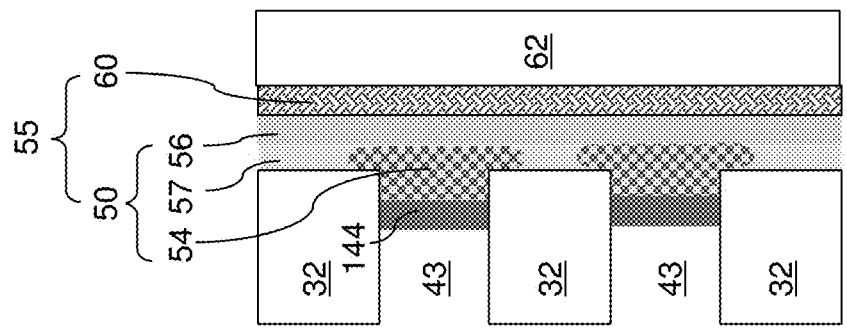

FIGS. 14A and 14B are sequential vertical cross-sectional views of a region of the exemplary structure during formation of electrically conductive layers 46 in case the third exemplary memory opening fill structure of FIG. 7F is present in each memory opening 49 according to the third embodiment of the present disclosure.

Referring to FIG. 14A, a third configuration of the exemplary structure is illustrated, which corresponds to the case in which the third exemplary memory opening fill structure is present in each memory opening 49. The outer sidewall of each blocking dielectric material portion 144 can be physically exposed to a respective one of the backside recesses 43.

Referring to FIG. 14B, a subset of the processing steps of FIG. 12B can be partly performed to form an electrically conductive layer 46 within each backside recess 43 without forming the backside blocking dielectric layer. Specifically, the processing step for forming the backside blocking dielectric layer 44 can be omitted, and the processing steps for forming the electrically conductive layers 46 can be performed. In this case, each of the electrically conductive layers 46 can be formed directly on an outer sidewall of a respective one of the blocking dielectric material portions 144 and directly on horizontal surfaces of a respective neighboring pair of insulating layers 32.

Generally, each of the second dielectric oxide material portions 54 is laterally spaced from the electrically conductive layers 46 by a respective blocking dielectric material portion 144. In the third configuration of the exemplary structure illustrated in FIG. 14B, each of the blocking dielectric material portions 144 has an annular cylindrical configuration. Thus, each blocking dielectric material portion 144 may comprise an inner cylindrical sidewall, an outer cylindrical sidewall, an upper annular horizontal surface, and a lower annular horizontal surface. The inner cylindrical sidewall contacts an outer sidewall segment of a respective one of the second dielectric oxide material portions 54. The outer cylindrical sidewall contacts a respective electrically conductive layer 46. The upper annular horizontal surface and the lower annular horizontal surface contact a respective one of the insulating layers 32. In other words, each blocking dielectric material portion 144 may have a shape of an annular cylinder contacting a bottom surface of a respective overlying one of the insulating layers 32 and contacting a top surface of a respective underlying one of the insulating layers 32. Each of the electrically conductive layers 46 contacts a bottom surface of a respective overlying one of the insulating layers 32 and a top surface of a respective underlying one of the insulating layers 32. In one embodiment, each of the blocking dielectric material portions 144 may consist essentially of a dielectric oxide of the second element.

FIGS. 15A-15D are sequential vertical cross-sectional views of a region of the exemplary structure during formation of electrically conductive layers 46 in case the fourth exemplary memory opening fill structure of FIG. 8C is present in each memory opening according to the fourth embodiment of the present disclosure.

Referring to FIG. 15A, a fourth configuration of the exemplary structure is illustrated, which corresponds to the case in which the fourth exemplary memory opening fill structure of FIG. 8C is present in each memory opening 49. The outer sidewall of a first dielectric oxide layer 57L can be physically exposed to a respective one of the backside recesses 43.

Referring to FIG. 15B, in-process dielectric oxide material portions comprising, and/or consisting essentially of, an outer dielectric oxide material can be formed. For example, an in-process dielectric oxide material layer 44' including the outer dielectric oxide material can be formed on physically exposed surface segments of the first dielectric oxide layer 57L and horizontal surfaces of the insulating layers 32. The outer dielectric oxide material of the in-process dielectric oxide material layer 44' may be the same as the outer dielectric oxide material of the in-process dielectric oxide material portions 53' employed during formation of the first, second, or third exemplary memory opening fill structures.

The second element within the outer dielectric oxide material of the in-process dielectric oxide material layer 44' is different from the first element. The in-process dielectric oxide material layer 44' is formed in peripheral regions of the backside cavities 43, which are cavities formed by removal of portions of the sacrificial material layers 42. Particularly, the in-process dielectric oxide material layer 44' can be formed in cavities formed by removal of the portions of the sacrificial material layers 42 that are proximal to each memory opening 49 after formation of the first dielectric oxide layer 57L.

In the fourth configuration of the exemplary structure illustrated in FIG. 15B, the spacer material layers are formed as sacrificial material layers 42, and backside recesses 43 are formed by removing the sacrificial material layers 42 after formation of the tunneling dielectric layer 56 and the vertical semiconductor channel 60. The in-process dielectric oxide material portions are formed as in-process backside blocking dielectric layers 44' that are conformally deposited in the backside recesses 43 directly on physically exposed surface segments of the first dielectric oxide layer 57L. The in-process backside blocking dielectric layers 44' may be deposited by a conformal deposition process, such as a chemical vapor deposition process or an atomic layer deposition process, and may have a same thickness throughout. The thickness of each in-process backside blocking dielectric layer 44' may be in a range from 3 nm to 20 nm, such as from 4 nm to 12 nm, although lesser and greater thicknesses may also be employed.

Referring to FIG. 15C, a thermal anneal process can be performed to induce interdiffusion between the first dielectric oxide material (i.e., an inner dielectric oxide material) of the first dielectric oxide layer 57L and the outer dielectric oxide material of the in-process backside blocking dielectric layers 44'. The elevated temperature and the duration of the thermal anneal process can be selected such that the in-process backside blocking dielectric layers 44' and portions of the first dielectric oxide layer 57L that are proximal to the in-process backside blocking dielectric layers 44' interdiffuse with each other to form the second backside blocking dielectric layer portions 54 that comprise a second dielectric oxide material. In one embodiment, surface regions of the in-process backside blocking dielectric layers 44' may be converted into outer regions of the second backside blocking dielectric layer 54. The second dielectric oxide material is a compound of the first element, the second element, and oxygen. Specifically, the second dielectric oxide material is a dielectric oxide of the first element and the second element. Portions of the first dielectric oxide layer 57L that do not substantially change in material composition after the thermal anneal process are herein referred to first backside blocking dielectric layer 57.

Generally, intermixing of the atoms of the first element and atoms of the second element can be induced during the thermal anneal process across the first dielectric oxide material and the outer dielectric oxide material. A first vertical stack of first dielectric oxide material portions 57 interlaced with a second vertical stack of second dielectric oxide material portions 54 is formed.

A first vertical stack of first dielectric oxide material portions 57 and a second vertical stack of second dielectric oxide material portions 54 can be formed within each memory opening 49. The first vertical stack of the first dielectric oxide material portions 57 can be interlaced with the second vertical stack of the second dielectric oxide material portions 54 along the vertical direction. The first dielectric oxide material portions 57 are remaining portions of the first dielectric oxide layer 57L that remain at levels of the insulating layers 32. The second dielectric oxide material portions 54 are formed at levels of the spacer material layers (such as the sacrificial material layers 42), which are the levels of the backside recesses 43, and are the levels of the electrically conductive layers 46 to be subsequently formed. The second dielectric oxide material portions 54 comprise a mixed dielectric oxide material that is a dielectric oxide material of the first element and the second element.

In one embodiment, the first dielectric oxide material of the first dielectric oxide material portions 57 may comprise, and/or may consist essentially of, a dielectric oxide material of the first element, which may be selected from Al, Si, or transition metal element. The second dielectric oxide material, i.e., the mixed dielectric oxide material, of the second dielectric oxide material portions 54 may be located at levels of the spacer material layers (such as the sacrificial material layers 42) and may comprise, and/or may consist essentially of, the first element and the second element. The second element is different from the first element, and can be selected from Al, Si, or transition metal element.

In one embodiment, the second dielectric oxide material portions 54 can have a compositional gradient in which the atomic concentration of the second element increases with a distance from a most proximal interface with the first dielectric oxide material portions 57. In one embodiment, the atomic concentration of the first element within the first dielectric oxide material portions 57 may be at least 99% of the atomic concentration of all metal atoms within the first dielectric oxide material portions 57.

In one embodiment, each of the second dielectric oxide material portions 54 may have a greater lateral thickness between a respective inner sidewall and a respective outer sidewall than each of the first dielectric oxide material portions 57. In one embodiment, inner sidewalls of the second dielectric oxide material portions 54 and inner sidewalls of the first dielectric oxide material portions 57 may be vertically coincident with each other (i.e., located within a same vertical cylindrical plane), and outermost sidewall segments of the second dielectric oxide material portions 54 may be laterally offset outward from the outer sidewalls of the first dielectric oxide material portions 57.

Each outer sidewall of the second dielectric oxide material portions 57 may have a stepped vertical cross-sectional profile. In one embodiment, each outer sidewall of the second dielectric oxide material portions 57 may comprise a primary cylindrical outer sidewall segment in contact with a respective spacer material layer (such as a respective sacrificial material layer 42), an upper annular horizontal surface segment in contact with a respective overlying insulating layer 32, an upper cylindrical outer sidewall segment in contact with the respective overlying insulating layer 32, a lower annular horizontal surface segment in contact with a respective underlying insulating layer 32, and a lower cylindrical outer sidewall segment in contact with the respective underlying insulating layer 32. In one embodiment, one, and/or a plurality, and/or each, and of the second dielectric oxide material portions 54 contacts a horizontal bottom surface and a sidewall of an overlying one of the insulating layers 32, and a horizontal top surface and a sidewall of an underlying one of the insulating layers 32.

Each remaining portion of the in-process backside blocking dielectric layers 44' constitutes a backside blocking dielectric layer 44. The backside blocking dielectric layers 44 may comprise, and/or may consist essentially of, the dielectric oxide of the second element. Each backside blocking dielectric layer 44 may comprise an upper horizontally-extending portion contacting a bottom surface of a respective overlying insulating layer 32, a lower horizontally-extending portion contacting a top surface of a respective underlying insulating layer 32, and a cylindrical portion laterally surrounding, and contacting, a respective second dielectric oxide material portion 54. In one embodiment, the cylindrical portion of each backside blocking dielectric layer 44 may have a lesser thickness than the upper horizontally-extending portion and the lower horizontally-extending portion of the respective backside blocking dielectric layer 44.

Referring to FIG. 15D, the processing steps of FIG. 14B can be performed to form the electrically conductive layer 46 within each backside recess 43. In this case, each of the electrically conductive layers 46 can be formed directly on a respective backside blocking dielectric layer 44.

Generally, each of the second dielectric oxide material portions 54 is laterally spaced from the electrically conductive layers 46 by a respective blocking dielectric material portion. In the fourth configuration of the exemplary structure illustrated in FIG. 15D, each of the blocking dielectric material portions may comprise a respective backside blocking dielectric layer 44. In one embodiment, each of the blocking dielectric material portions may consist essentially of a dielectric oxide of the second element.

Each backside blocking dielectric layer 44 embeds a respective one of the electrically conductive layers 46 and comprises a respective upper horizontally-extending portion contacting a bottom surface of a respective overlying one of the insulating layers 32, a respective lower horizontally-extending portion contacting a top surface of a respective underlying one of the insulating layers 32, and a cylindrical portion laterally surrounding the memory opening fill structure 58 and vertically connecting an inner periphery of the respective upper horizontally-extending potion and an inner periphery of the respective lower horizontally-extending portion. In one embodiment, a lateral thickness between an inner sidewall and an outer sidewall of the cylindrical potion is less than a vertical thickness of the respective upper horizontally-extending portion and is less than a vertical thickness of the respective lower horizontally-extending portion.

Figure 16:
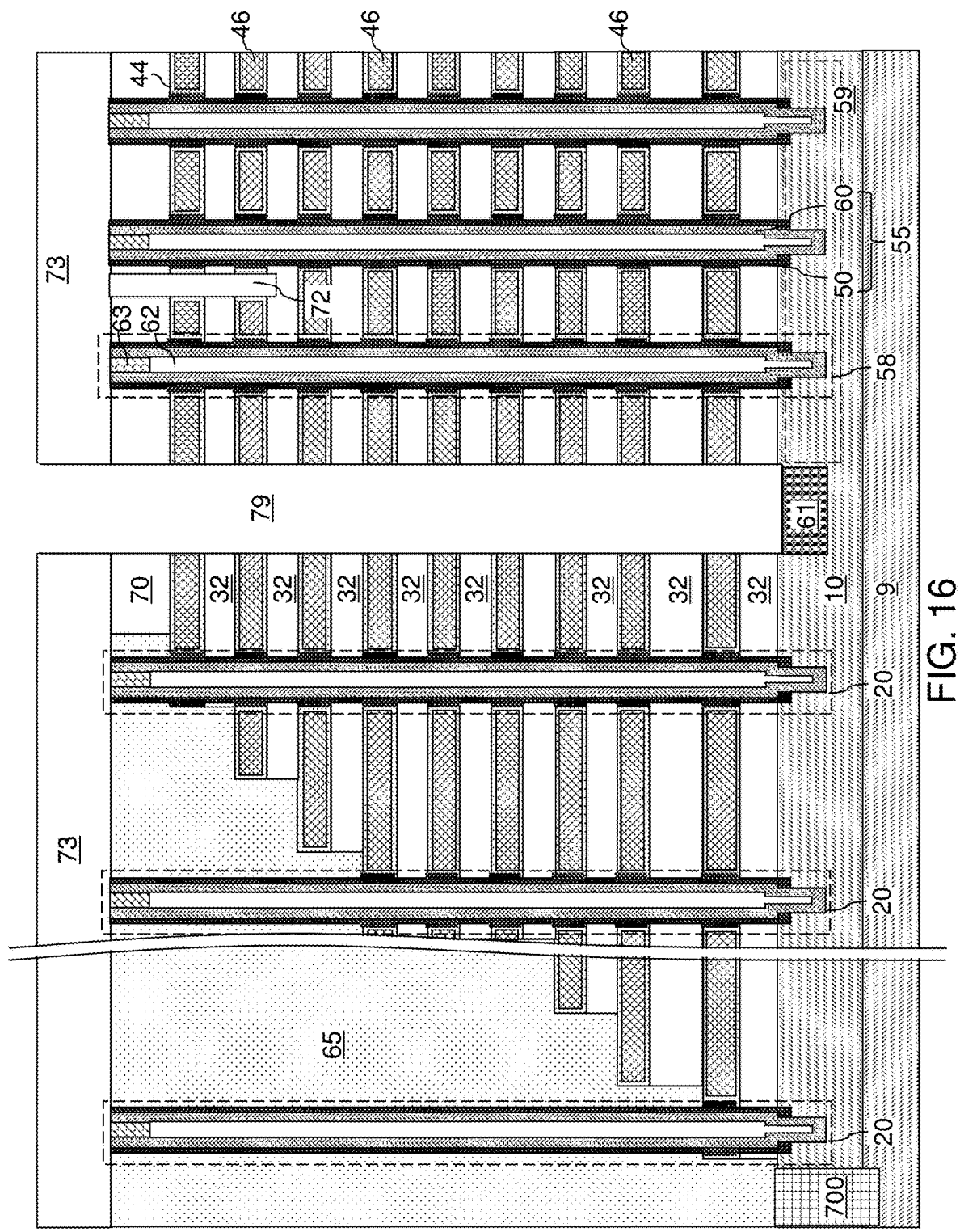
FIG. 16 is a schematic vertical cross-sectional view of the exemplary structure after formation of the electrically conductive layers according to an embodiment of the present disclosure.

Referring to FIG. 16, the exemplary structure is illustrated at a processing step that corresponds to the processing steps of FIG. 12B, FIG. 13B, FIG. 14B, or FIG. 15D.

Figure 17:
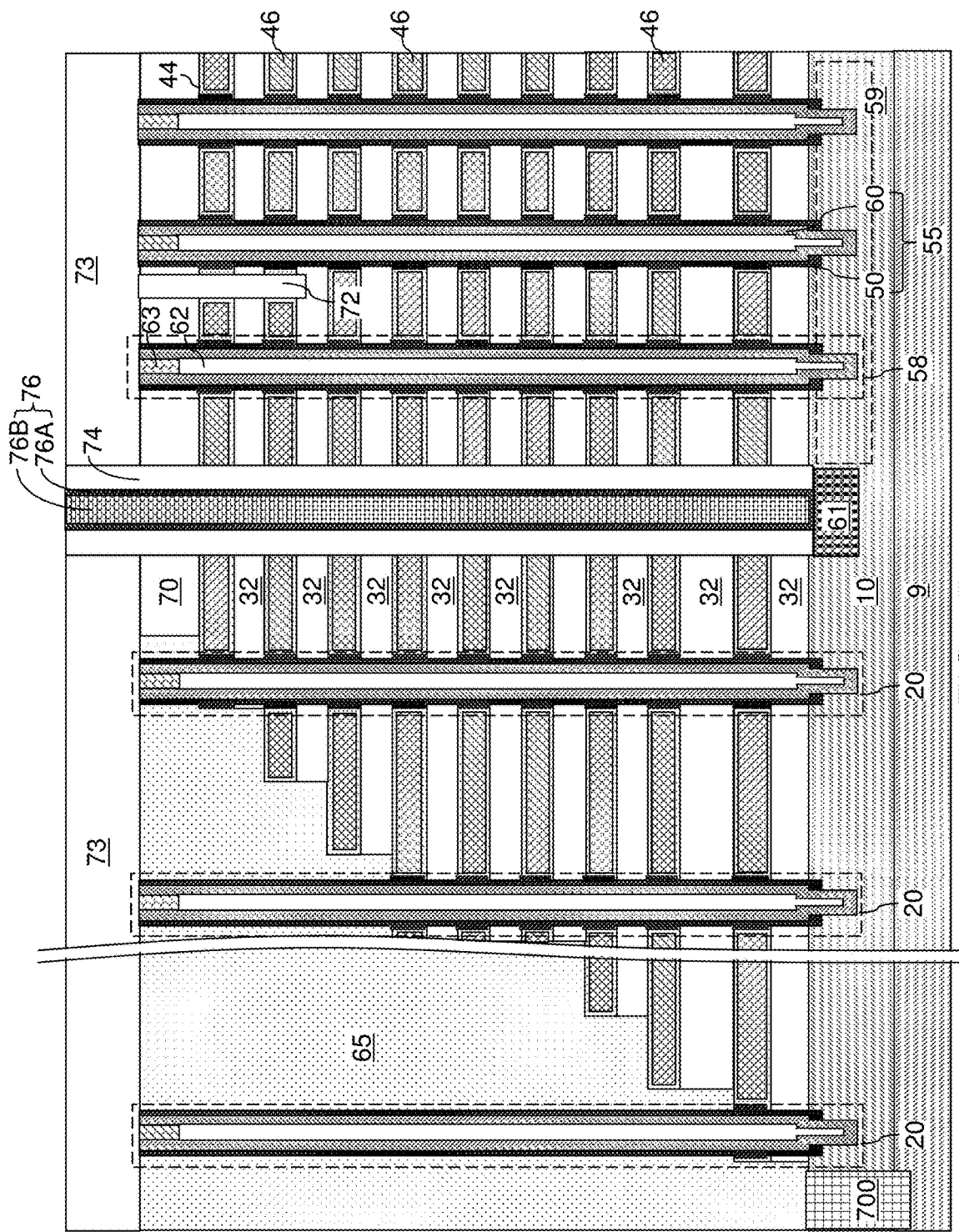
FIG. 17 is a schematic vertical cross-sectional view of the exemplary structure after formation of an insulating spacer and a backside contact structure according to an embodiment of the present disclosure.

Referring to FIG. 17, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present on sidewalls of the backside trenches 79, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity is present within a volume surrounded by each insulating spacer 74. A top surface of the semiconductor material layer 10 can be physically exposed at the bottom of each backside trench 79.

A backside contact via structure 76 can be formed within each backside cavity. Each contact via structure 76 can fill a respective cavity. The contact via structures 76 can be formed by depositing at least one conductive material in the remaining unfilled volume (i.e., the backside cavity) of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Alternatively, the above described insulating material layer can be formed in the backside trenches 79 to completely fill the entire volume of a backside trench 79 and may consist essentially of at least one dielectric material. In this alternative embodiment, the source region 61 and the backside trench via structure 76 may be omitted, and a horizontal source line (e.g., direct strap contact) may contact an side of the lower portion of the semiconductor channel 60.

Figure 18A:
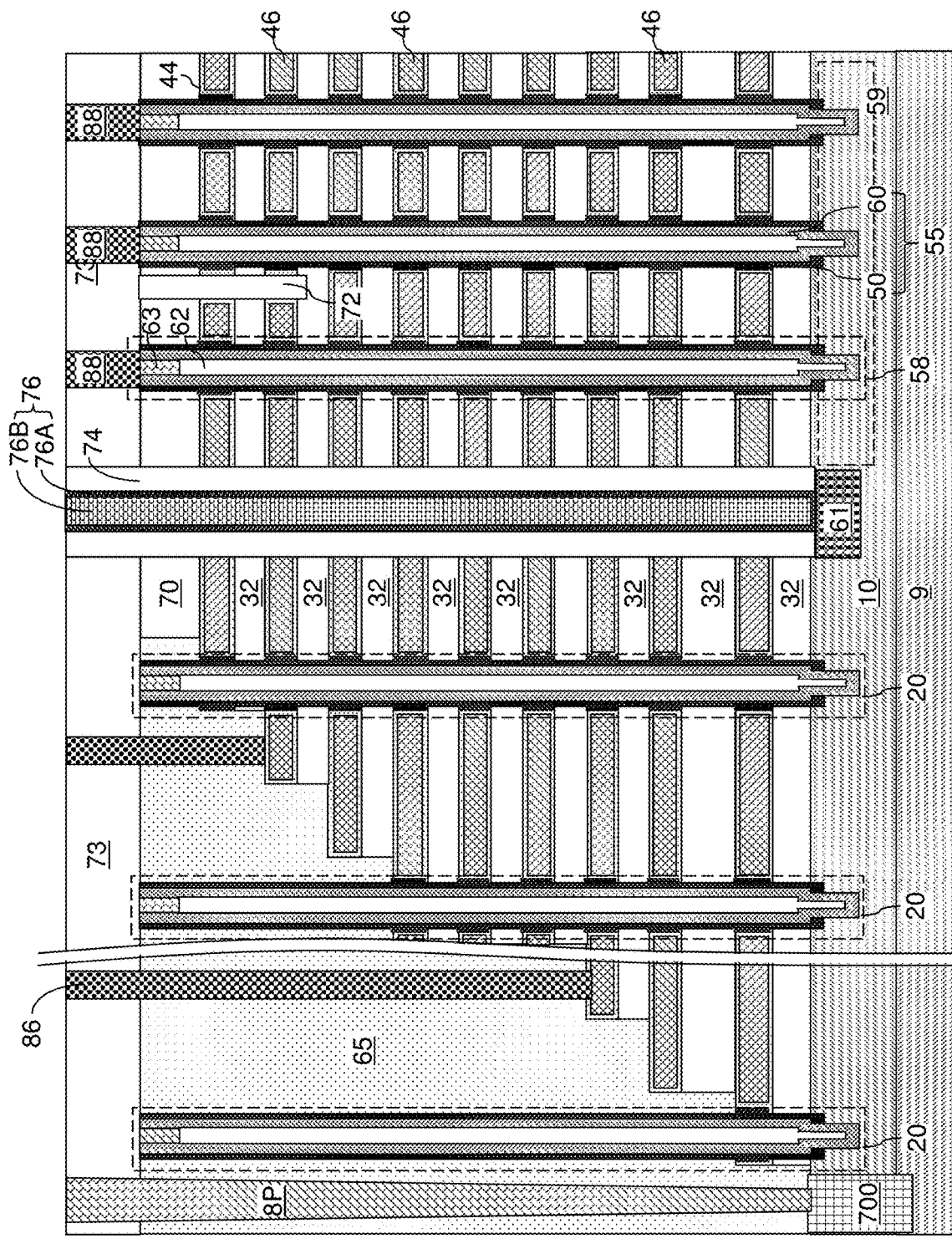
FIG. 18A is a schematic vertical cross-sectional view of the exemplary structure after formation of additional contact via structures according to an embodiment of the present disclosure.
Figure 18B:
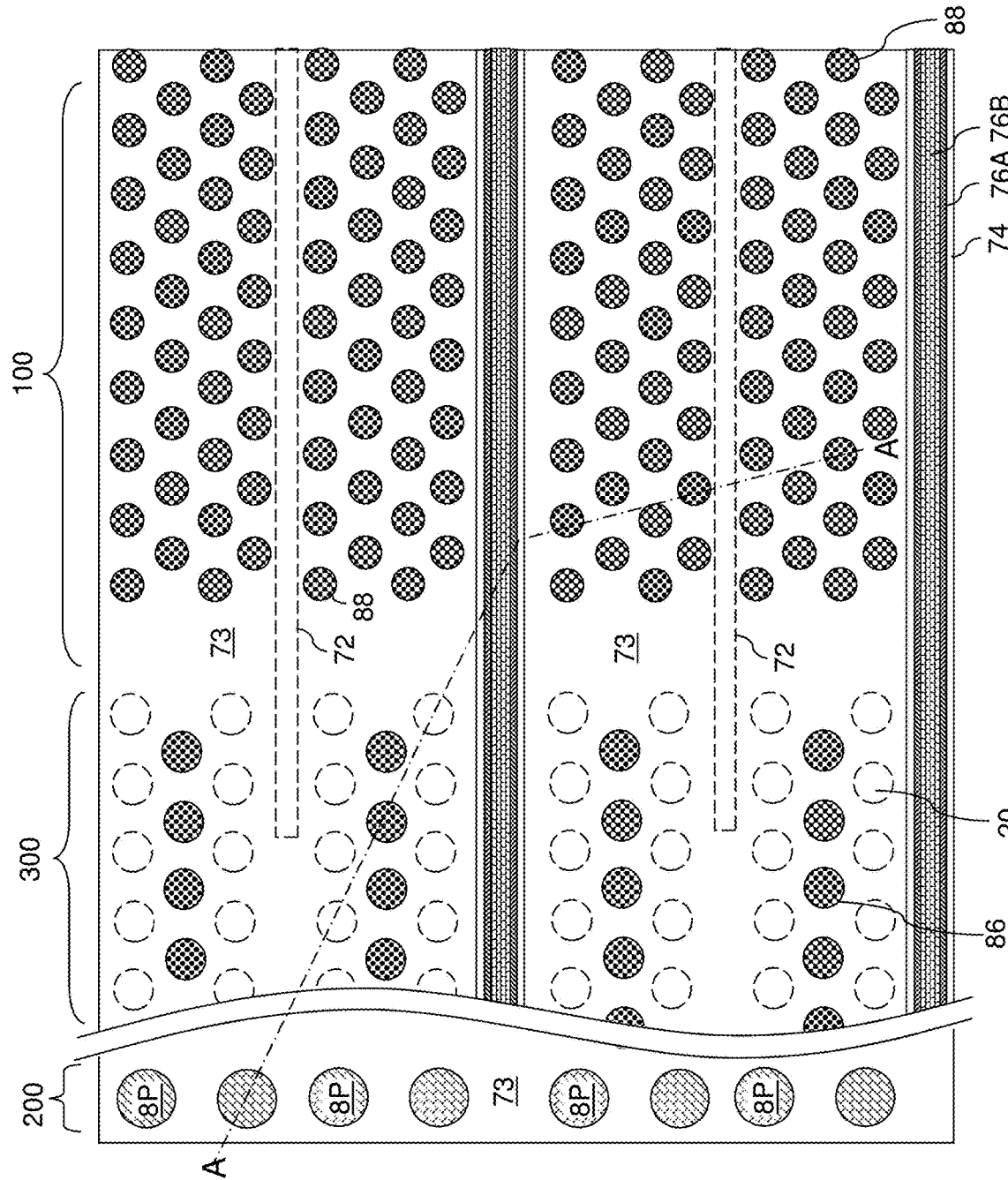
FIG. 18B is a top-down view of the exemplary structure of FIG. 18A. The vertical plane A-A' is the plane of the schematic vertical cross-sectional view of FIG. 18A.

Referring to FIGS. 18A and 18B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

Referring to all drawings and according to various embodiments of the present disclosure, a memory device, such as a three-dimensional memory device, is provided. The memory device comprises: an alternating stack of insulating layers 32 and electrically conductive layers 46 located over a substrate (9, 10); a memory opening 49 vertically extending through the alternating stack (32, 46); and a memory opening fill structure 58 located in the memory opening 49 and comprising a vertical semiconductor channel 60 and a memory film 50. The memory film comprises: a tunneling dielectric layer 56 in contact with the vertical semiconductor channel 60; a first vertical stack of first dielectric oxide material portions 57 located at levels of the insulating layers 32 and comprising a dielectric oxide material of a first element selected from Al, Si, or transition metal element; and a second vertical stack of second dielectric oxide material portions 54 located at levels of the electrically conductive layers 46 and comprising a mixed dielectric oxide material that is a dielectric oxide material of the first element and a second element that is selected from Al, Si, or transition metal element and different from the first element.

In one embodiment, the second dielectric oxide material portions 54 comprise discrete charge storage portions, and each of the second dielectric oxide material portions 54 is laterally spaced from the electrically conductive layers 46 by a respective blocking dielectric material portion (44, 144).

In one embodiment, the second dielectric oxide material portions 54 have a compositional gradient in which an atomic concentration of the second element increases with a distance from a most proximal interface with the first dielectric oxide material portions 57. In one embodiment, an atomic concentration of the first element within the first dielectric oxide material portions 57 is at least 99% of an atomic concentration of all metal atoms within the first dielectric oxide material portions 57.

In one embodiment, the first vertical stack of the first dielectric oxide material portions 57 contacts first surface segments of an outer sidewall of the tunneling dielectric layer 56; and the second vertical stack of the second dielectric oxide material portions 54 contacts second surface segments of the outer sidewall of the tunneling dielectric layer 56.

In one embodiment, each of the second dielectric oxide material portions 54 has a greater lateral thickness (e.g., between a respective inner sidewall and a respective outer sidewall) than a lateral thickness of each of the first dielectric oxide material portions 57.

In one embodiment, one, a plurality, and/or each, of the second dielectric oxide material portions 54 contacts a horizontal bottom surface and a sidewall of an overlying one of the insulating layers 32, and a horizontal top surface and a sidewall of an underlying one of the insulating layers 32.

In one embodiment, the vertical semiconductor channel 60 comprises silicon (e.g., polysilicon). A conduction band offset of the mixed dielectric oxide material of the second dielectric oxide material portions 54 is between 2.3 eV and 2.5 eV relative to at least one of a Fermi level of the electrically conductive layers 46 or a conduction band of the vertical semiconductor channel 60.

In one embodiment, a combination of the first element and the second element is selected from: a combination of titanium and silicon (in a forward order or in a reverse order); a combination of hafnium and silicon (in a forward order or in a reverse order); a combination of titanium and aluminum (in a forward order or in a reverse order); a combination of hafnium and aluminum (in a forward order or in a reverse order); a combination of tantalum and aluminum (in a forward order or in a reverse order); a combination of aluminum and yttrium (in a forward order or in a reverse order); or a combination of silicon and yttrium (in a forward order or in a reverse order).

In one embodiment, the second dielectric oxide material portions have an average material composition that is selected from: $Ti_\alpha Si_{1-\alpha} O_{2(1+\theta)}$ in which a is in a range from 0.15 to 0.35; $Hf_\beta Si_{1-\beta} O_{2(1+\theta)}$ in which $\beta$ is in a range from 0.34 to 0.54; $Ti_\gamma Al_{4/3(1-\gamma)} O_{2(1+\theta)}$ in which $\gamma$ is in a range from 0.04 to 0.24; $Hf_\delta Al_{4/3(1-\delta)} O_{2(1+\theta)}$ in which $\delta$ is in a range from 0.19 to 0.39; $Ta_\varepsilon Al_{4/3(1-\varepsilon)} O_{2(1+\theta)}$ in which $\varepsilon$ is in a range from 0.06 to 0.26; $Al_\zeta Y_{1-\zeta} O_{1.5(1+\theta)}$ in which (is in a range from 0.10 to 0.30; or $Si_\eta Y_{4/3\ (1-\eta)} O_{2(1+\theta)}$ in which n is in a range from 0.01 to 0.21, and wherein 0 has a value in a range from −0.1 to 0.1.

Table 1 tabulates the conduction band offsets of exemplary charge storage mixed oxide materials of the second dielectric oxide material portions 54 and the dielectric constant of the exemplary charge storage mixed oxide materials. Each of the exemplary charge storage materials has a conduction band offset of about 2.4 eV (relative to the conduction band of the silicon vertical semiconductor channel and/or relative to the Fermi level of the word lines) and has a dielectric constant greater than the dielectric constant of silicon nitride (which is 7.9). Dielectric constants greater than 11.0 can be provided by the mixed metal oxides.

TABLE 1

Conduction band offsets and dielectric constants of some embodiment mixed dielectric oxide materials that may be used as charge storage portion materials.

| Mixed dielectric oxide material | Conduction band offset | Dielectric constant |
|---|---|---|
| $Ti_{0.25}Si_{0.75}O_2$ | 2.4 eV | 22.9 |
| $Hf_{0.44}Si_{0.56}O_2$ | 2.4 eV | 13.2 |
| $Ti_{0.14}Al_{0.86}O_{1.57}$ | 2.4 eV | 18.9 |
| $Hf_{0.29}Al_{0.71}O_{1.645}$ | 2.4 eV | 13.6 |
| $Ta_{0.16}Al_{0.84}O_{1.58}$ | 2.4 eV | 11.1 |
| $Al_{0.2}Y_{0.8}O_{1.5}$ | 2.4 eV | 13.8 |
| $Si_{0.11}Y_{0.89}O_{1.555}$ | 2.4 eV | 13.8 |

In one embodiment, each of the blocking dielectric material portions (44, 144) comprises a backside blocking dielectric layer 44 embedding a respective one of the electrically conductive layers 46 and comprising a respective upper horizontally-extending portion contacting a bottom surface of a respective overlying one of the insulating layers 32, a respective lower horizontally-extending portion contacting a top surface of a respective underlying one of the insulating layers 32, and a cylindrical portion laterally surrounding the memory opening fill structure and vertically connecting an inner periphery of the respective upper horizontally-extending potion and an inner periphery of the respective lower horizontally-extending portion.

In one embodiment, each of the backside blocking dielectric layers 44 in direct contact with an outer sidewall of a respective one of the second dielectric oxide material portions 54 as illustrated in FIGS. 12B and 15D.

In one embodiment, each of the backside blocking dielectric layers 44 is laterally spaced from a respective one of the second dielectric oxide material portions 54 by a respective annular cylindrical dielectric material portion 53 consisting essentially of a dielectric oxide of the second element as illustrated in FIG. 13B.

In one embodiment, the respective blocking dielectric material portion (44, 144) consists essentially of a dielectric oxide of the second element as illustrated in FIGS. 14B and 15D.

In one embodiment, the respective blocking dielectric material portion 144 has a shape of an annular cylinder contacting a bottom surface of a respective overlying one of the insulating layers 32 and contacting a top surface of a respective underlying one of the insulating layers 32; and each of the electrically conductive layers 46 contacts a bottom surface of a respective overlying one of the insulating layers 32 and a top surface of a respective underlying one of the insulating layers 32, as illustrated in FIG. 14B.

In one embodiment shown in FIG. 15D, the respective blocking dielectric portion comprises the backside blocking dielectric layer 44 embedding a respective one of the electrically conductive layers 46 and comprising a respective upper horizontally-extending portion contacting a bottom surface of a respective overlying one of the insulating layers 32, a respective lower horizontally-extending portion contacting a top surface of a respective underlying one of the insulating layers 32, and a cylindrical portion laterally surrounding the memory opening fill structure 58 and vertically connecting an inner periphery of the respective upper horizontally-extending potion and an inner periphery of the respective lower horizontally-extending portion. A lateral thickness between an inner sidewall and an outer sidewall of the cylindrical potion is less than a vertical thickness of the respective upper horizontally-extending portion and is less than a vertical thickness of the respective lower horizontally-extending portion as illustrated in FIG. 15D.

The various embodiments of the present disclosure may be employed to provide a vertical stack of charge storage elements (i.e., the vertical stack of second dielectric oxide material portions 54) having a conduction band offset around 2.4 eV and having a dielectric constant greater than 7.9 to enhance charge trapping characteristics in a three-dimensional memory device.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A memory device, comprising:
   an alternating stack of insulating layers and electrically conductive layers located over a substrate;
   a memory opening vertically extending through the alternating stack; and
   a memory opening fill structure located in the memory opening and comprising a vertical semiconductor channel and a memory film,
   wherein the memory film comprises:
      a tunneling dielectric layer in contact with the vertical semiconductor channel;
      a first vertical stack of first dielectric oxide material portions located at levels of the insulating layers and comprising a dielectric oxide material of a first element selected from Al, Si, or transition metal element; and
      a second vertical stack of second dielectric oxide material portions located at levels of the electrically conductive layers and comprising a mixed dielectric oxide material that is a dielectric oxide material of the first element and a second element that is selected from Al, Si, or transition metal element and different from the first element.

2. The memory device of claim 1, wherein:
   the second dielectric oxide material portions comprise discrete charge storage portions; and
   each of the second dielectric oxide material portions is laterally spaced from the electrically conductive layers by a respective blocking dielectric material portion.

3. The memory device of claim 2, wherein each of the blocking dielectric material portions comprises a backside blocking dielectric layer embedding a respective one of the electrically conductive layers and comprising a respective upper horizontally-extending portion contacting a bottom surface of a respective overlying one of the insulating layers, a respective lower horizontally-extending portion contacting a top surface of a respective underlying one of the insulating layers, and a cylindrical portion laterally surrounding the memory opening fill structure and vertically connecting an inner periphery of the respective upper horizontally-extending potion and an inner periphery of the respective lower horizontally-extending portion.

4. The memory device of claim 3, wherein the backside blocking dielectric layer is in direct contact with an outer sidewall of a respective one of the second dielectric oxide material portions.

5. The memory device of claim 3, wherein the backside blocking dielectric layer is laterally spaced from a respective one of the second dielectric oxide material portions by a respective annular cylindrical dielectric material portion.

6. The memory device of claim 2, wherein the respective blocking dielectric material portion consists essentially of a dielectric oxide of the second element.

7. The memory device of claim 6, wherein:
the respective blocking dielectric material portion has a shape of an annular cylinder contacting a bottom surface of a respective overlying one of the insulating layers and contacting a top surface of a respective underlying one of the insulating layers; and
each of the electrically conductive layers contacts a bottom surface of a respective overlying one of the insulating layers and a top surface of a respective underlying one of the insulating layers.

8. The memory device of claim 1, wherein the second dielectric oxide material portions have a compositional gradient in which an atomic concentration of the second element increases with a distance from a most proximal interface with the first dielectric oxide material portions.

9. The memory device of claim 1, wherein:
the first vertical stack of the first dielectric oxide material portions contacts first surface segments of an outer sidewall of the tunneling dielectric layer; and
the second vertical stack of the second dielectric oxide material portions contacts second surface segments of the outer sidewall of the tunneling dielectric layer.

10. The memory device of claim 1, wherein a lateral thickness of each of the second dielectric oxide material portions is greater than a lateral thickness of each of the first dielectric oxide material portions.

11. The memory device of claim 1, wherein one of the second dielectric oxide material portions contacts:
a horizontal bottom surface and a sidewall of an overlying one of the insulating layers; and
a horizontal top surface and a sidewall of an underlying one of the insulating layers.

12. The memory device of claim 1, wherein the vertical semiconductor channel comprises a silicon channel, and a conduction band offset of the mixed dielectric oxide material is between 2.3 eV and 2.5 eV relative to at least one of a Fermi level of the electrically conductive layers or a conduction band of the vertical semiconductor channel.

13. The memory device of claim 1, wherein a combination of the first element and the second element is selected from:
a combination of titanium and silicon;
a combination of hafnium and silicon;
a combination of titanium and aluminum;
a combination of hafnium and aluminum;
a combination of tantalum and aluminum;
a combination of aluminum and yttrium; or
a combination of silicon and yttrium.

14. The memory device of claim 1, wherein the second dielectric oxide material portions have an average material composition that is selected from:
$Ti_\alpha Si_{1-\alpha} O_{2(1+\theta)}$ in which $\alpha$ is in a range from 0.15 to 0.35;
$Hf_\beta Si_{1-\beta} O_{2(1+\theta)}$ in which $\beta$ is in a range from 0.34 to 0.54;
$Ti_\gamma Al_{4/3(1-\gamma)} O_{2(1+\theta)}$ in which $\gamma$ is in a range from 0.04 to 0.24;
$Hf_\delta Al_{4/3(1-\delta)} O_{2(1+\theta)}$ in which $\delta$ is in a range from 0.19 to 0.39;
$Ta_\varepsilon Al_{4/3(1-\varepsilon)} O_{2(1+\theta)}$ in which $\varepsilon$ is in a range from 0.06 to 0.26;
$Al_\zeta Y_{1-\zeta} O_{1.5(1+\theta)}$ in which $\zeta$ is in a range from 0.10 to 0.30; or
$Si_\eta Y_{4/3(1-\eta)} O_{2(1+\theta)}$ in which $\eta$ is in a range from 0.01 to 0.21,
and wherein $\theta$ has a value in a range from −0.1 to 0.1.

15. A method of forming a memory device, comprising:
forming an alternating stack of insulating layers and spacer material layers over a substrate, wherein the spacer material layers are formed as or are subsequently replaced with electrically conductive layers;
forming a memory opening through the alternating stack;
forming a first dielectric oxide layer comprising a dielectric oxide of a first element on a sidewall of the memory opening;
forming in-process dielectric oxide material portions in contact with the first dielectric oxide layer, wherein the in-process dielectric oxide material portions comprise a dielectric oxide of a second element that is different from the first element;
intermixing the first dielectric oxide layer and the in-process dielectric oxide material portions to form discrete charge storage portions comprising a mixed dielectric oxide material of the first element and the second element; and
forming a tunneling dielectric layer and a vertical semiconductor channel after formation of the first dielectric oxide layer.

16. The method of claim 15, wherein:
the intermixing comprises annealing the first dielectric oxide layer and the in-process dielectric oxide material portions to form a first vertical stack of first dielectric oxide material portions interlaced with a second vertical stack of second dielectric oxide material portions;
the first dielectric oxide material portions comprise remaining portions of the first dielectric oxide layer that remain at levels of the insulating layers; and
the second dielectric oxide material portions are formed at levels of the electrically conductive layer and comprise the discrete charge storage portions.

17. The method of claim 15, wherein each of the first element and the second element is independently selected from Al, Si, or transition metal element.

18. The method of claim 15, wherein the vertical semiconductor channel comprises a silicon channel, and a conduction band offset of the mixed dielectric oxide material is between 2.3 eV and 2.5 eV relative to at least one of a Fermi level of the electrically conductive layers or a conduction band of the vertical semiconductor channel.

19. The method of claim 15, further comprising:
forming lateral recesses around the memory opening by laterally recessing proximal portions of the spacer material layers selective to the insulating layers;
forming the in-process dielectric oxide material portions in the lateral recesses, wherein the first dielectric oxide layer is deposited over the in-process dielectric oxide material portions; and
replacing the spacer material layers which comprise sacrificial material layers with electrically conductive layers after forming the in-process dielectric oxide material portions in the lateral recesses.

20. The method of claim 15, further comprising
forming backside recesses by removing the spacer material layers which comprise sacrificial material layers after formation of the tunneling dielectric layer and the vertical semiconductor channel;
forming backside blocking dielectric layers in the backside recesses directly on physically exposed surface segments of the first dielectric oxide layer to form the in-process dielectric oxide material portions; and
forming the electrically conductive layers directly on the backside blocking dielectric layers.

\* \* \* \* \*